US007896456B2

(12) United States Patent
Iwashita et al.
(10) Patent No.: US 7,896,456 B2
(45) Date of Patent: Mar. 1, 2011

(54) METHOD FOR DRIVING LIQUID EJECTOR

(75) Inventors: Shuzo Iwashita, Kirishima (JP); Sin Ishikura, Kirishima (JP); Takayuki Yamamoto, Kirishima (JP); Hisamitsu Sakai, Kirishima (JP)

(73) Assignee: Kyocera Corporation, Kyoto (JP)

( * ) Notice: Subject to any disclaimer, the term of this patent is extended or adjusted under 35 U.S.C. 154(b) by 680 days.

(21) Appl. No.: 11/993,010

(22) PCT Filed: Jun. 23, 2006

(86) PCT No.: PCT/JP2006/312622

§ 371 (c)(1), (2), (4) Date: Dec. 18, 2007

(87) PCT Pub. No.: WO2006/137528

PCT Pub. Date: Dec. 28, 2006

(65) Prior Publication Data

US 2010/0118072 A1 May 13, 2010

(30) Foreign Application Priority Data

Jun. 24, 2005 (JP) ............................. 2005-185791
Dec. 27, 2005 (JP) ............................. 2005-376131

(51) Int. Cl.
*B41J 29/38* (2006.01)
*B41J 2/045* (2006.01)
*H01L 41/00* (2006.01)
*H02N 2/00* (2006.01)

(52) U.S. Cl. ............................... 347/10; 347/9; 347/11; 347/68; 347/70; 347/72; 310/324; 310/342; 310/358

(58) Field of Classification Search .................. 347/10, 347/11, 70
See application file for complete search history.

(56) References Cited

U.S. PATENT DOCUMENTS 5,124,716 A 6/1992 Roy et al. .................... 346/1.1

(Continued)

FOREIGN PATENT DOCUMENTS

EP 1378358 A1 1/2004

(Continued)

OTHER PUBLICATIONS

European search report for corresponding European application 06870659.6 lists the references above, date: Nov. 24, 2009.

*Primary Examiner*—Uyen-Chau N Le
*Assistant Examiner*—Kajli Prince
(74) *Attorney, Agent, or Firm*—DLA Piper LLP (US)

(57) ABSTRACT

A method for driving a liquid drop ejector (1) equipped with a piezoelectric actuator (7) including a piezoelectric ceramic layer (6) having a size covering a plurality of pressurizing chambers (2). An arbitrary piezoelectric deformation region (8) of the liquid drop ejector (1) is deflected in one thickness direction and the opposite direction, respectively, by applying a driving voltage waveform including a first voltage ($-V_L$) and an equivalent second voltage ($+V_L$) of the opposite polarity in order to vary the volume of the pressurizing chambers (2) of a corresponding liquid drop ejecting portion (4), and a liquid drop is ejected through a communicating nozzle (3). Since gradual creep deformation of the inactive region (16) of the piezoelectric ceramic layer (6) is prevented, the ink drop ejection performance is maintained at a good level over a long term.

8 Claims, 12 Drawing Sheets

U.S. PATENT DOCUMENTS

| | | | | |
|---|---|---|---|---|
| 5,155,498 | A | 10/1992 | Roy et al. | 346/1.1 |
| 5,170,177 | A | 12/1992 | Stanley et al. | 346/1.1 |
| 5,381,162 | A | 1/1995 | Roy et al. | 347/10 |
| 5,495,270 | A | 2/1996 | Burr et al. | 347/10 |
| 5,576,743 | A | 11/1996 | Momose et al. | 347/11 |
| 5,689,291 | A | 11/1997 | Tence et al. | 347/10 |
| 5,736,993 | A | 4/1998 | Regimbal et al. | 347/11 |
| 6,899,409 | B2 | 5/2005 | Kusunoki | |
| 7,125,107 | B2 | 10/2006 | Satake et al. | |
| 7,322,663 | B2 | 1/2008 | Sanada | |
| 2003/0189609 | A1 * | 10/2003 | Ishikawa | 347/11 |
| 2004/0017413 | A1 | 1/2004 | Kusunoki | |
| 2005/0024400 | A1 | 2/2005 | Satake et al. | |
| 2005/0104913 | A1 | 5/2005 | Sanada | |

FOREIGN PATENT DOCUMENTS

| | | |
|---|---|---|
| JP | 62-025059 | 2/1987 |
| JP | 02-192947 | 7/1990 |
| JP | 06-340075 | 12/1994 |
| JP | 07-125193 | 5/1995 |
| JP | 07-178926 | 7/1995 |
| JP | 10-166579 | 6/1998 |
| JP | 11-034341 | 2/1999 |

* cited by examiner

METHOD FOR DRIVING LIQUID EJECTOR

CROSS-REFERENCE TO THE RELATED APPLICATIONS

This application is a national stage of the international application No. PCT/JP2006/312622 filed Jun. 23, 2006, which also claims benefit of priority under 35 U.S.C. §119 to Japanese Patent Application No. 2005-185791 filed Jun. 24, 2005and Japanese Patent Application No. 2005-376131 filed Dec. 27, 2005, the entire contents of both of which are incorporate herein by reference.

TECHNICAL FIELD

The present invention relates to a method for driving a liquid ejector.

PRIOR ART

FIG. 2 is a sectional view showing an example of a liquid ejector 1 employed for an on-demand ink jet printer or the like. FIG. 3 is a sectional view showing a principal part of the example of the liquid ejector 1 in an enlarged manner. Referring to FIGS. 2 and 3, the liquid ejector 1 of this example includes a substrate 5 formed by arranging a plurality of liquid droplet ejecting portions 4 having pressurizing chambers 2 to be filled with ink and nozzles 3 for ejecting the ink from'the pressurizing chambers 2 as ink droplets in the plane direction and a plate-shaped piezoelectric actuator 7, including a piezoelectric ceramic layer 6 having a size covering the plurality of pressurizing chambers 2 of the substrate 5, laminated on the substrate 5.

The piezoelectric actuator 7 is divided into a plurality of piezoelectric deformation regions 8 arranged correspondingly to the respective pressurizing chambers 2 and individually deflected in the thickness direction by individual voltage application and a restricted region 9 arranged to surround the piezoelectric deformation regions 8 and fixed to the substrate 5 to be prevented from deformation.

The piezoelectric actuator 7 of the example shown in the figures has a so-called unimorphic structure including individual electrodes 10 individually formed on the upper surface of the piezoelectric ceramic layer 6 in both figures correspondingly to the respective pressuring chambers 2 for defining the piezoelectric deformation regions 8 as well as a common electrode 11 and a oscillator plate 12 successively laminated on the lower surface of the piezoelectric ceramic layer 6 each having a size covering the plurality of pressurizing chambers 2. The individual electrodes 10 and the common electrode 11 are separately connected to a driving circuit 13, and the driving circuit 13 is connected to control unit 14.

The piezoelectric ceramic layer 6 is made of a piezoelectric material such as PZT, for example, and previously polarized in the thickness direction to have piezoelectric deformation properties of a so-called transverse vibration mode. When the driving circuit 13 is driven by a control signal from the control unit 14 and a voltage of the same direction as the direction of the polarization is applied between an arbitrary individual electrode 10 and the common electrode 11, an active region 15 corresponding to the piezoelectric deformation region 8 sandwiched between these electrodes 10 and 11 is contracted in the layer plane direction, as shown by white lateral arrows in FIG. 3.

However, the lower surface of the piezoelectric ceramic layer 6 is fixed to the oscillator plate 12 through the common electrode 11. Therefore, the piezoelectric deformation region 8 of the piezoelectric actuator 7 is deflected in accordance with the contraction of the active region 15 to protrude in the direction of the pressurizing chamber 2 as shown by a white downward arrow in FIG. 3 and to vibrate the ink filled into the pressurizing chamber 2, so that the ink pressurized by this vibration is ejected through a nozzle 3 as ink droplet.

As described in Patent Document 1, a so-called pull-push driving method is widely and generally employed in the liquid ejector. FIG. 11 is a graph showing the relation between an example of a driving voltage waveform (shown by thick one-dot chain lines) of a driving voltage $V_P$ applied to the active region 15 of the piezoelectric ceramic layer 6 for driving the liquid ejector 1 shown in FIG. 2 by the pull-push driving method and changes [shown by a thick solid line, (+) denotes the distal end of the nozzle 3, i.e., the ink droplet ejection side, and (−) denotes the side of the pressurizing chamber 2] in the volume velocity of the ink in the nozzle 3 upon application of this driving voltage waveform in a simplified manner.

FIG. 12 is a graph showing the relation between the example of the driving voltage waveform (shown by thick one-dot chain lines) of the driving voltage $V_P$ applied to the active region 15 of the piezoelectric ceramic layer 6 for driving the liquid ejector 1 shown in FIG. 2 by the pull-push driving method and displacements [shown by a thick solid line, (−) denotes the direction of the pressurizing chamber 2 (direction reducing the volume of the pressurizing chamber 2) and (+) denotes the direction opposite to the direction of the pressurizing chamber (direction increasing the volume of the pressurizing chamber 2)] of the piezoelectric deformation region 8 of the piezoelectric actuator 7 upon application of this driving voltage waveform in a simplified manner.

Referring to FIGS. 2, 3 and 11, in a standby state on the left side of $t_1$ in FIG. 11 not ejecting ink droplets from the nozzle 3, the driving voltage $V_P$ is maintained at $V_H$ ($V_P=V_H$) and the active region 15 is continuously contracted in the plane direction. Thus, the piezoelectric deformation region 8 is deflected so as to protrude in the direction of the pressurizing chamber 2 to keep the volume of the pressurizing chamber 2 reduced, while the ink remains in a stationary state, i.e., the volume velocity of the ink in the nozzle 3 is maintained at 0, and an ink meniscus formed in the nozzle 3 by the surface tension of the ink remains stationary.

In order to eject ink droplets from the nozzle 3 and form a dot on a sheet surface, the driving voltage $V_p$ applied to the active region 15 is discharged ($V_P=0$) at the preceding time $t_1$ for releasing the active region 15 from the contraction in the plane direction, thereby releasing the piezoelectric deformation region 8 from the deflection. Thus, the volume of the pressurizing chamber 2 is increased by a certain amount, whereby the ink meniscus in the nozzle 3 is drawn into the pressurizing chamber 2 by this increment of the volume. At this time, the volume velocity of the ink in the nozzle 3 is temporarily increased toward the (−) side and thereafter gradually reduced to finally approach 0, as shown in the portion between $t_1$ and $t_2$ in FIG. 11. This corresponds to generally a half cycle of the natural vibration cycle $T_1$ of the volume velocity of the ink shown by the thick solid line.

At the time $t_2$ when the volume velocity of the ink in the nozzle 3 infinitely approaches 0, the driving voltage $V_P$ is charged to $V_H$ ($V_P=V_H$) again for contracting the active region 15 in the plane direction, thereby deflecting the piezoelectric deformation region 8. Thus, the volume of the pressurizing chamber 2 is reduced due to the deflection of the piezoelectric deformation region 8 so that the pressure of the ink extruded from the pressurizing chamber 2 is applied to the ink in the nozzle 3 going to return in the direction of the distal end of the nozzle 3 contrarily to the state where the ink meniscus is most remarkably drawn into the pressurizing chamber 2 (the state where the volume velocity is 0 at the time $t_2$). Consequently, the ink in the nozzle 3 is accelerated in the direction of the distal end of the nozzle 3 to remarkably protrude outward from the nozzle 3.

At this time, the volume velocity of the ink in the nozzle 3 is temporarily increased toward the (+) side and thereafter gradually reduced to finally approach 0, as shown in the portion between $t_2$ and $t_3$ in FIG. 11. The ink protruding outward from the nozzle 3 seems generally cylindrical, whereby the protruding ink is referred to as an ink column in general.

At the time ($t_3$ in FIG. 11) when the volume velocity of the ink protruding outward from the nozzle 3 infinitely approaches 0, the driving voltage $V_P$ is discharged ($V_P$=0) again for releasing the active region 15 from the contraction in the plane direction, thereby releasing the piezoelectric deformation region 8 from the deflection. Thus, a negative pressure formed by releasing the piezoelectric deformation region 8 from the deflection and increasing the volume of the pressurizing chamber 2 again is applied to the ink going to return into the pressurizing chamber 2 contrarily to the state most remarkably protruding outward of the nozzle 3 (the state where the volume velocity is 0 at the time $t_3$). Consequently, the ink column extending from the nozzle 3 to the utmost is cut off to form a first ink droplet.

After the ink column is cut off, the ink in the nozzle 3 is drawn into the pressurizing chamber 2 again. At this time, the volume velocity of the ink in the nozzle 3 is temporarily increased toward the (−) side and thereafter gradually reduced to finally approach 0, as shown in the portion between $t_3$ and $T_4$ in FIG. 11. This corresponds to generally a half cycle of the natural vibration cycle $T_1$ of the volume velocity of the ink, as hereinabove described.

At the time $t_4$ when the volume velocity of the ink in the nozzle 3 infinitely approaches 0, the driving voltage $V_P$ is charged to $V_H$($V_P$=$V_H$) again for contracting the active region 15 in the plane direction, thereby deflecting the piezoelectric deformation region 8. Thus, the ink remarkably protrudes outward from the nozzle 3 again to form an ink column, due to the same mechanism as that of the aforementioned behavior of the ink between the times $t_2$ and $t_3$. At this time, the volume velocity of the ink in the nozzle 3 is temporarily increased toward the (+) side and thereafter gradually reduced to finally approach 0, as shown in the portion between $t_4$ and $t_5$ in FIG.

11.

After the time ($t_5$ in FIG. 11) when the volume velocity of the ink in the nozzle 3 reaches 0, the speed of vibration of the ink is directed toward the pressurizing chamber 2, whereby the ink column extending from the nozzle 3 to the utmost is cut off to form a second ink droplet. The first and second ink droplets thus formed in this manner spatter onto the sheet surface opposed to the distal end of the nozzle 3 individually to form one dot.

The series of operations correspond to application of the driving voltage $V_P$ having the driving voltage waveform including two pulses each having a pulse width $T_2$ of about half of the natural vibration cycle $T_1$ to the active region 15, as shown by the thick one-dot chain lines in FIG. 11. In order to form one dot with only one ink droplet, the driving voltage waveform may include only one pulse. In order to form one dot with not less than three ink droplets, the pulse may be generated by the frequency corresponding to the number of the ink droplets. Patent Document 1: Japanese Unexamined Patent Publication No. 02-102947 A (1990)

DISCLOSURE OF THE INVENTION

Problems to be Solved

In order to drive the liquid ejector 1 having the unimorphic piezoelectric actuator 7 shown in FIGS. 2 and 3 by the pull-push driving method, the active region 15 of the piezoelectric ceramic layer 6 must be continuously contracted in the plane direction in the standby state not ejecting ink droplets from the nozzle 3 as hereinabove described. Accordingly, an inactive region 16 of the piezoelectric ceramic layer 6 surrounding the active region 15 is continuously expanded by tensile stress in directions shown by black arrows in FIG. 3 over a long period in the standby state due to the contraction of the active region 15 in the plane direction.

The inactive region 16 is gradually creep-deformed due to the domain rotating therein to relax the stress as the time of the expansion resulting from the tensile stress is increased. As a result, the active region 15 released from the contraction has a high degree of potential that it cannot be expanded up to the original stationary state due to compressive stress received from the creep-deformed inactive region 16. In the piezoelectric deformation region 8 of the piezoelectric actuator 7, therefore, the displacement in the thickness direction between the state deflected in the direction shown by the white downward arrow in FIG. 3 and the stationary state released from this deflection is gradually reduced to cause a problem of reduction in the ink droplet ejection performance.

In the pull-push driving method, further, a noise is caused in the vibration of the displacement of the piezoelectric deformation region 8 as shown by a thick solid line in FIG. 12 when the driving voltage $V_P$ applied to the active region 15 is discharged ($V_P$=0) for driving the piezoelectric deformation region 8 of the piezoelectric actuator 7. The vibration of this noise (noise vibration) is added to the aforementioned vibration of the ink resulting in a problem to destabilize the ejection of ink droplets from the nozzle 3.

In addition, the piezoelectric actuator 7 of the unimorphic type or the like having the piezoelectric ceramic layer 6 integrally formed in the size covering the plurality of pressurizing chambers 2 easily causes a so-called crosstalk transmitting the noise vibration also to other adjacent piezoelectric deformation region 8 provided on the piezoelectric actuator 7 when the crosstalk arises, there also lies a problem that the ejection of ink droplets from the nozzle 3 corresponding to the other piezoelectric deformation region 8 is destabilized.

The reason of causing the noise vibration may be attributed as follows: the displacement of the deflection is remarkable and elastic energy is remarkably stored in the standby state continuously applying the driving voltage $V_P$ to the active region 15 and continuously deflecting the piezoelectric deformation region 8 in the thickness direction; the piezoelectric deformation region 8 shifts at a stroke from the deflected state to a free vibratory state not constrained in shape by the applied voltage at a stretch when the driving voltage $V_P$ is discharged ($V_P$=0) in order to drive the piezoelectric deformation region 8; and the like.

These problems arise not only in the unimorphic piezoelectric actuator but also in a bimorphic piezoelectric actuator expanding/contracting two piezoelectric ceramic layers having piezoelectric deformation properties of the transverse vibration mode in opposite directions thereby entirely deflecting the same in the thickness direction and in a monomorphic piezoelectric actuator deflecting a single piezoelectric ceramic layer in the thickness direction without laminating a oscillator plate thereon by preparing the same from a gradient function material or by utilizing a semiconductor effect, so far as each of the piezoelectric ceramic layers is integrally formed in a size covering a plurality of pressurizing chambers.

Further, the piezoelectric ceramic layer must inevitably be integrally formed in the size covering the plurality of pressurizing chambers in order to further refine the liquid ejector as compared with the present structure correspondingly to refinement of the dot pitch associated with improvement in the picture quality of the ink jet printer and in order to manufacture the same with excellent productivity through the minimum number of steps. As a result, techniques are required for preventing gradual creep deformation of the inactive region surrounding the active regions and preventing occurrence of noise vibration destabilizing the ejection of ink droplets in driving state of the piezoelectric deformation region.

An object of the present invention is to provide a method for driving a liquid ejector including a piezoelectric actuator including a piezoelectric ceramic layer having a size covering a plurality of pressurizing chambers, capable of maintaining the ink droplet ejection performance at an excellent level over a long period by preventing gradual creep deformation of an inactive region of the piezoelectric ceramic layer and preventing occurrence of noise vibration destabilizing ejection of ink droplets in driving of a piezoelectric deformation region.

Solutions to the Problems

The invention according to Claim 1 provides a method for driving a liquid ejector that comprises:

(A) a substrate formed by arranging a plurality of liquid droplet ejecting portions each having a pressurizing chamber to be filled with a liquid and a nozzle communicating with the pressurizing chamber for ejecting the liquid from the pressurizing chamber as a liquid droplet in a plane direction; and (B) a plate-shaped piezoelectric actuator laminated on the substrate including at least one piezoelectric ceramic layer having a size covering a plurality of pressurizing chambers of the substrate, while the piezoelectric actuator is divided into a plurality of piezoelectric deformation regions arranged correspondingly to the respective pressurizing chambers and individually deflected in a thickness direction by individual voltage application and a restricted region surrounding the piezoelectric deformation regions, characterized that:

a driving voltage waveform including a first voltage and a second voltage equivalent to the first voltage and opposite in polarity thereto is applied to an arbitrary piezoelectric deformation region of the piezoelectric actuator of the liquid ejector, for deflecting the piezoelectric deformation region in one thickness direction and the opposite direction each and varying a volume of the pressurizing chamber of the corresponding liquid droplet ejecting portion to eject a liquid droplet through the nozzle communicating with the pressurizing chamber.

The invention according to Claim 2 is the method for driving a liquid ejector according to Claim 1, the piezoelectric ceramic layer is made of a PZT-type piezoelectric ceramic material and divided into an active region corresponding to the piezoelectric deformation regions and an inactive region corresponding to the restricted region, while the C-axis orientation $I_C$ of the ceramic material obtained from the intensity $I_{(200)}$ of a diffraction peak of the [200] plane and the intensity $I_{(002)}$ of a diffraction peak of the [002] plane in an X-ray diffraction spectrum by the following expression (1):

$$I_C=I_{(002)}/I_{(002)}+I_{(200)}) \tag{1}$$

is kept in the range of 1 to 1.1 times as that in an undriven initial state after driving.

The invention according to Claim 3 is the method for driving a liquid ejector according to Claim 1 or 2, wherein an area of a P-E hysteresis loop showing the relation between the intensity of electric field E (kV/cm) and the polarization quantity P (μC/cm$^2$) of the piezoelectric ceramic layer in driving by applying the driving voltage waveform to the piezoelectric deformation region of the piezoelectric actuator is set to not more than 1.3 times of an area of a P-E hysteresis loop in driving by applying a driving voltage waveform on-off controlling a single polarity voltage having a value twice of the value of the first and second voltages of the driving voltage waveform to the piezoelectric deformation region.

The invention according to Claim 4 is the method for driving a liquid ejector according to any one of Claims 1 to 3, wherein the first and second voltages are set to such a value that the intensity of electric field E (kV/cm) of the piezoelectric deformation region of the piezoelectric actuator is not more than 0.8 times of the intensity of a coercive electric field Ec of the piezoelectric ceramic layer. The invention according to Claim 5 is the method for driving a liquid ejector according to any one of Claims 1 to 4, wherein a state is maintained applying no voltage to the piezoelectric deformation region in a standby state not ejecting liquid droplets.

The invention according to Claim 6 is the method for driving a liquid ejector according to any one of Claims 1 to 5, wherein the piezoelectric actuator comprises:

(i) a single piezoelectric ceramic layer divided into an active region corresponding to a piezoelectric deformation region expanded/contracted in the plane direction by voltage application in the thickness direction and an inactive region corresponding to the restricted region; and (ii) a oscillator plate laminated on one side of the piezoelectric ceramic layer and deflected in the thickness direction due to the expansion/contraction of the active region in the plane direction, and the piezoelectric deformation region of the piezoelectric actuator is vibrated in the thickness direction by applying the driving voltage waveform to the active region of the piezoelectric ceramic layer and expanding/contracting the active region in the plane direction.

The invention according to Claim 7 is the method for driving a liquid ejector according to any one of Claims 1 to 5, wherein the piezoelectric actuator comprises:

(I) a first piezoelectric ceramic layer divided into an active region corresponding to a piezoelectric deformation region expanded/contracted in the plane direction by voltage application in the thickness direction and an inactive region corresponding to the restricted region; and (II) a second piezoelectric ceramic layer laminated on one side of the first piezoelectric ceramic layer and expanded/contracted in the plane direction by voltage application in the thickness direction, and the piezoelectric deformation region of the piezoelectric actuator is vibrated in the thickness direction by expanding/contracting the second piezoelectric ceramic layer in antiphase with expansion/contraction of the active region synchronously with application of the driving voltage waveform to the active region of the first piezoelectric ceramic layer for expanding/contracting the active region in the plane direction.

The invention according to Claim 8 is the method for driving a liquid ejector according to Claim 1 or 2, wherein the piezoelectric actuator includes a single piezoelectric ceramic layer divided into an active region corresponding to the piezoelectric deformation region deflected in the thickness direction by voltage application and an inactive region corresponding to the restricted region, and the piezoelectric deformation region of the piezoelectric actuator is vibrated in the thickness direction by applying the driving voltage waveform to the piezoelectric ceramic layer.

Effect of the Invention

In the invention according to Claim 1, the piezoelectric deformation region of the piezoelectric actuator is deflected in one thickness direction and the opposite direction individually and vibrated by applying the driving voltage waveform including the first voltage and the second voltage opposite in polarity to the first voltage and equivalent thereto. Therefore, in a unimorphic piezoelectric actuator, for example, the active region of the piezoelectric ceramic layer can be not only contracted in the plane direction and released from the contraction similarly to the conventional one but also expanded in the plane direction in ejection of an ink droplet and compressive stress can be applied to the inactive region surrounding the active region. As a result, the inactive region can be prevented from gradual creep deformation resulting in conventional one-sided expansion in the plane direction.

This also applies to other types of piezoelectric actuators. In a conventional bimorphic piezoelectric actuator, for example, an active region of a single piezoelectric ceramic layer (referred to as a first piezoelectric ceramic layer) must be continuously contracted in the plane direction while an active region of the other piezoelectric ceramic layer (referred to as a second piezoelectric ceramic layer) must be continuously expanded in the plane direction in a standby state. As a result, the respective inactive regions is gradually creep-deformed to be expanded in the plane direction in the first piezoelectric ceramic layer and to be contracted in the plane direction in the second piezoelectric ceramic layer.

According to the driving method of the invention in Claim 1, however, the active region of the first piezoelectric ceramic layer is expanded in the plane direction so that compressive stress can be applied to the inactive region surrounding the active region while the active region of the second piezoelectric ceramic layer is contracted in the plane direction so that tensile stress can be applied to the inactive region surrounding the active region. Thus, the inactive regions around the respective active regions can be prevented from gradual creep deformation.

In a conventional monomorphic piezoelectric actuator, on the other hand, an active region of a piezoelectric ceramic layer is continuously deflected in one layer thickness direction in a standby state. As a result, an inactive region is gradually creep-deformed so that an area of the inactive region in the thickness direction corresponding to the protruding side of the active region is compressed in the plane direction and an opposite area is expanded in the plane direction. In the driving method according to Claim 1 of the present invention, however, the piezoelectric ceramic layer is deflected also in the direction opposite to thickness direction so that tensile stress can be applied to the area of the inactive region in the thickness direction corresponding to the protruding side of the active region and compressive stress can be applied to an opposite area. Accordingly, the inactive region around the active region can be prevented from gradual creep deformation.

According to the driving method of the invention in Claim 1, the displacement of the deflected piezoelectric deformation region in the thickness direction with respect to a stationary state not subjected to voltage application can also be reduced as compared with the conventional one. Assuming that the displacement in the thickness direction between the stationary state and the deflected state is 1 in a conventional driving method deflecting the piezoelectric deformation region of the piezoelectric actuator only in one direction, for example, the displacements for deflecting the piezoelectric deformation region in one thickness direction and the opposite direction for setting the total displacement of the piezoelectric deformation region of the piezoelectric actuator in the thickness direction identically to 1 can be each generally halved in the driving method according to Claim 1 of the present invention. Therefore, the tensile stress applied to the inactive region of the piezoelectric ceramic layer can be reduced when the piezoelectric deformation region is deflected, whereby the inactive region can be further reliably prevented from gradual creep deformation.

According to the driving method of the invention in Claim 1, further, it is also possible to suppress occurrence of noise vibration destabilizing ejection of ink droplets caused in the conventional pull-push driving method in driving of the piezoelectric deformation region of the piezoelectric actuator. In other words, the displacement of the deflection of the piezoelectric deformation in the standby state can be reduced as compared with the conventional one in the driving method according to Claim 1 of the present invention as hereinabove described, whereby storage of elastic energy can be reduced.

Further, the piezoelectric deformation region can be constrained in shape in the state deflected in the thickness direction by the voltage application in the standby state and can be constrained in shape in the state deflected in the opposite direction by application of the voltage opposite in polarity in a driving state. Accordingly, occurrence of noise vibration can be suppressed in each state.

Therefore, destabilization of ejection of ink droplets from the nozzle corresponding to the piezoelectric deformation region as well as destabilization of ejection of ink droplets from the nozzle corresponding to an adjacent piezoelectric deformation region resulting from occurrence of a crosstalk can be reliably prevented by suppressing occurrence of noise vibration in vibration of the displacement of the piezoelectric deformation region in the driving state.

According to the driving method of the invention in Claim 1, therefore, the ink droplet ejection performance can be maintained at an excellent level over a long period by preventing gradual creep deformation of the inactive region of the piezoelectric ceramic layer having the size covering the plurality of pressurizing chambers included in the piezoelectric actuator of the liquid ejector and preventing destabilization of ejection of ink droplets resulting from noise vibration caused in the driving state of the piezoelectric deformation region.

According to the driving method of the invention in Claim 1, further, creep deformation of the inactive region of the piezoelectric ceramic layer can be prevented as hereinabove described. As a result, the crystalline state of the inactive region can be prevented from changing. In addition, the crystalline state of the active region can also be prevented from changing due to compressive stress received from the creep-deformed inactive region. Therefore, the crystalline states of both regions of the piezoelectric ceramic layer can be maintained in the initial states.

When the piezoelectric ceramic layer is made of a PZT-type piezoelectric ceramic material, as mentioned in Claim 2, for example, both of the crystalline states of the active region and the inactive region can be so maintained that the C-axis orientation $I_C$ showing the crystalline state of the ceramic material obtained from the intensity $I_{(200)}$ of the diffraction peak of the [200] plane and the intensity $I_{(002)}$ of the diffraction peak of the [002] plane in the X-ray diffraction spectrum by the following expression (1):

$$I_C = I_{(002)}/(I_{(002)}+I_{(200)}) \quad (1)$$

is kept in the range of 1 to 1.1 times as that in the undriven initial state after driving.

According to the driving method of the invention in Claim 3, the area of the P-E hysteresis loop showing the relation between the intensity of electric field E (kV/cm) and the polarization quantity P (μC/cm$^2$) of the piezoelectric ceramic layer in driving by applying the driving voltage waveform to the piezoelectric deformation region of the piezoelectric actuator is set to not more than 1.3 times of the area of the P-E hysteresis loop of the conventional pull-push driving voltage waveform shown in FIG. 11 and yet in the case where the driving voltage ($V_H$) is twice of the value of the first and second voltages for reducing hysteresis loss. Thus, piezoelectric deformation properties can be prevented from reduction resulting from depolarization of the piezoelectric ceramic layer caused by self heating.

According to the driving method of the invention in Claim 4, the hysteresis loss is further reduced by setting the first and second voltages of the driving voltage waveform to such a value that the intensity of electric field E (kV/cm) of the piezoelectric deformation region of the piezoelectric actuator is not more than 0.8 times of the intensity of the coercive electric field Ec of the piezoelectric ceramic layer. Accordingly, the piezoelectric deformation properties can be further reliably prevented from reduction resulting from depolarization of the piezoelectric ceramic layer caused by self heating.

According to the driving method of the invention in Claim 5, creep deformation of the inactive region of the piezoelectric ceramic layer can be further reliably prevented by maintaining the stationary state applying no voltage to the piezoelectric deformation region in the standby state not ejecting ink droplets.

The driving method according to the present invention is applicable to a liquid ejector including any one of the unimorphic (Claim 6), bimorphic (Claim 7) and monomorphic (Claim 8) piezoelectric actuators, as hereinabove described. In anyone of these cases, the ink droplet ejection performance can be maintained at an excellent level over a long period by preventing gradual creep deformation of the inactive region surrounding the active regions of the piezoelectric ceramic layer and preventing destabilization of ejection of ink droplets resulting from occurrence of noise vibration in the driving state of the piezoelectric deformation region.

BRIEF DESCRIPTION OF THE DRAWINGS

[FIG. 2] A sectional view showing an example of a liquid ejector including a unimorphic piezoelectric actuator employed for an on-demand ink jet printer or the like.

Figure 1:
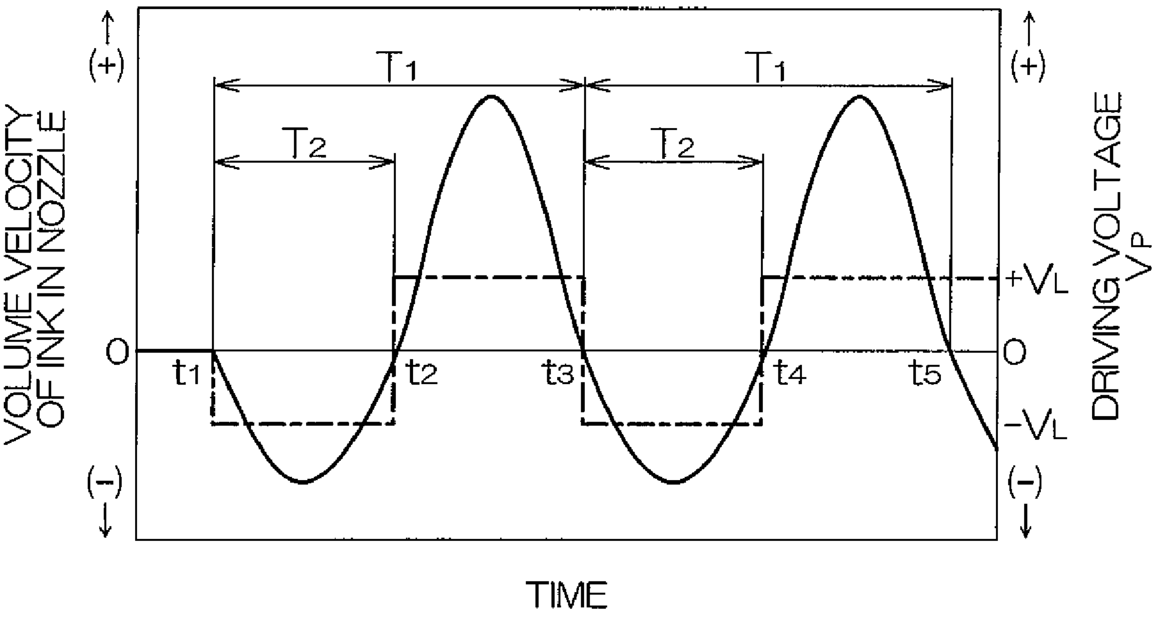
[FIG. 1] A graph showing the relation between an example of a driving voltage waveform of a driving voltage $V_P$ applied to an active region of a piezoelectric ceramic layer when a liquid ejector shown in FIG. 2 is driven by a driving method according to the present invention and changes of the volume velocity of ink in a nozzle upon application of this driving voltage waveform.

DESCRIPTION OF THE REFERENCE NUMERALS $-V_L$ first voltage
$+V_L$ second voltage
1 liquid ejector
2 pressuring chamber
3 nozzle
4 liquid droplet ejecting portion
5 substrate
6 (first) piezoelectric ceramic layer
7 piezoelectric actuator
8 piezoelectric deformation region
9 restricted region
12 oscillator plate
15 active region 16 inactive region 17 second piezoelectric ceramic layer

EMBODIMENTS OF THE INVENTION

Figure 2:
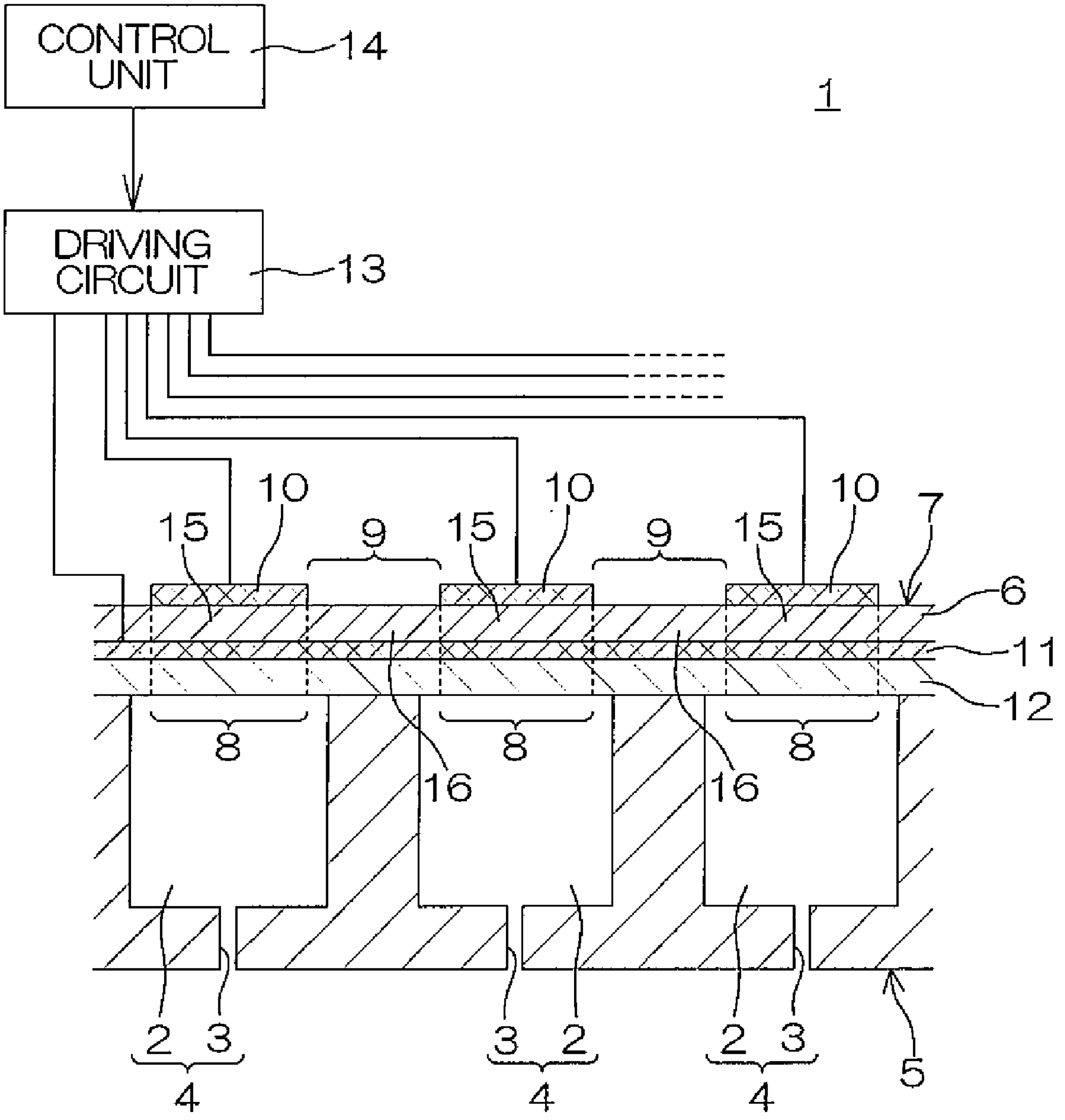

FIG. 1 is a graph showing the relation between an example of a driving voltage waveform (shown by a thick one-dot chain lines) of a driving voltage $V_P$ applied to the active region 15 of the piezoelectric ceramic layer 6 when the liquid ejector 1 shown in FIG. 2 is driven by the driving method according to the present invention and changes [shown by a thick solid line, (+) denotes the distal end of the nozzle 3, i.e., the ink droplet ejection side, and (−) denotes the side of the pressurizing chamber 2] of the volume velocity of the ink in the nozzle 3 upon application of this driving voltage waveform. FIG. 2 is a sectional view showing the example of the liquid ejector 1 including the unimorphic piezoelectric actuator 7 employed for an on-demand ink jet printer or the like.

Figure 3:
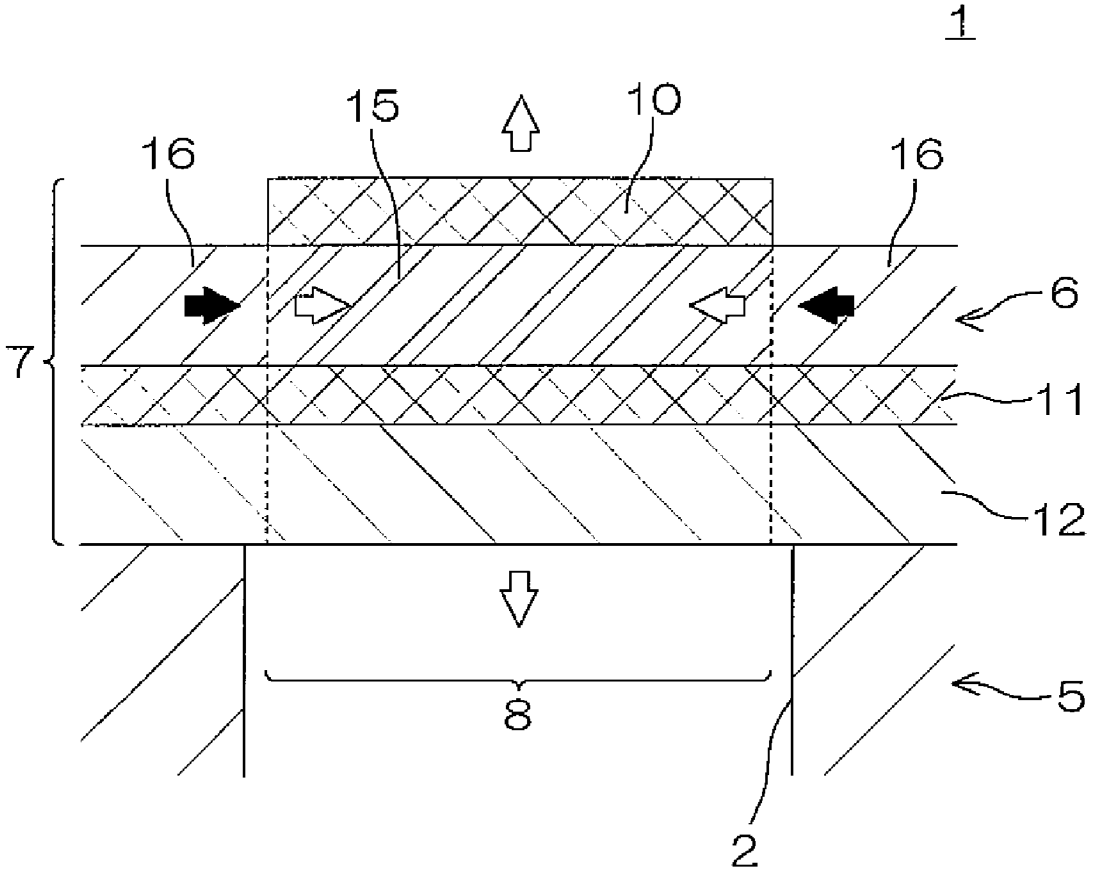
[FIG. 3] A sectional view showing a principal part of the example of the liquid ejector in an enlarged manner.

Referring to FIGS. 2 and 3, the liquid ejector 1 of this example includes, as hereinabove described, a substrate 5 formed by arranging a plurality of liquid droplet ejecting portions 4 each having a pressurizing chamber 2 to be filled with the ink and a nozzle 3 for ejecting the ink from the pressurizing chamber 2 as an ink droplet in the plane direction and the plate-shaped piezoelectric actuator 7, including a piezoelectric ceramic layer 6 having a size covering the plurality of pressurizing chambers 2 of the substrate 5, laminated on the substrate 5.

The piezoelectric actuator 7 is divided into a plurality of piezoelectric deformation regions 8 arranged correspondingly to the respective pressurizing chambers 2 and individually deflected in the thickness direction by individual voltage application and a restricted region 9 arranged to surround the piezoelectric deformation regions 8 and fixed to the substrate 5 to be prevented from deformation. Further, the piezoelectric actuator 7 of the example shown in figures has a so-called unimorphic structure including individual electrodes 10 individually formed on the upper surface of the piezoelectric ceramic layer 6 in both figures correspondingly to the respective pressuring chambers 2 for defining the piezoelectric deformation regions as well as a common electrode 11 and the oscillator plate 12 successively laminated on the lower surface of the piezoelectric ceramic layer 6 each having a size covering the plurality of pressurizing chambers 2. The individual electrodes 10 and the common electrode 11 are separately connected to the driving circuit 13, and the driving circuit 13 is connected to the control unit 14.

The piezoelectric ceramic layer 6 is made of a piezoelectric material such as PZT, for example, and previously polarized in the thickness direction to have piezoelectric deformation properties of so-called transverse vibration mode. When the driving circuit 13 is driven by a control signal from the control unit 14 and a voltage of the same direction ((+) direction in FIG. 1) as the direction of the polarization is applied between an arbitrary individual electrode 10 and the common electrode 11, an active region 15 corresponding to the piezoelectric deformation region 8 sandwiched between these electrodes 10 and 11 is contracted in the layer plane direction, as shown by the white lateral arrows in FIG. 3. Thus, the piezoelectric deformation region 8 of the piezoelectric actuator 7 is deflected so as to protrude in the direction of the pressurizing chamber 2 as shown by the white downward arrow in FIG. 3, since the lower surface of the piezoelectric ceramic layer 6 is fixed to the oscillator plate 12 through the common electrode 11.

When a voltage in the direction ((−) direction in FIG. 1) opposite to the direction of polarization is applied between the individual electrode 10 and the common electrode 11, on the other hand, the active region 15 is expanded in the layer plane direction oppositely to the lateral arrows in FIG. 3, whereby the piezoelectric deformation region 8 of the piezoelectric actuator 7 is deflected in the direction opposite to the pressurizing chamber 2, as shown by an upward arrow in FIG. 3. Therefore, the ink filled in the pressurizing chamber 2 can be vibrated and ejected through the nozzle 3 as ink droplets by repeating the deflection of the piezoelectric deformation region 8 in the direction of the pressurizing chamber 2 and the deflection in the direction opposite thereto.

Referring to FIGS. 1 to 3, a state not applying the driving voltage $V_P$ ($V_P$=0) but releasing the piezoelectric deformation region 8 from deflection is maintained in a standby state on the left side of $t_1$ in FIG. 1 not ejecting ink droplets from the nozzle 3, while the ink remains in a stationary state, i.e., the volume velocity of the ink in the nozzle 3 is maintained at 0, and an ink meniscus formed in the nozzle 3 by the surface tension of the ink remains stationary.

In order to form dots on a sheet surface by ejecting ink droplets from the nozzle 3, the driving voltage $V_P$ is charged ($V_P$=$-V_L$) to a first voltage ($-V_L$) opposite to the direction of polarization at the preceding time $t_1$ for expanding the active region 15 in the plane direction, thereby deflecting the piezoelectric deformation region 8 in the direction opposite to the pressurizing chamber 2. Thus, the volume of the pressurizing chamber 2 is increased by a certain amount, whereby the ink meniscus in the nozzle 3 is drawn into the pressurizing chamber 2 by this increment of the volume. At this time, the volume velocity of the ink in the nozzle 3 is temporarily increased toward the (−) side and thereafter gradually reduced to finally approach 0, as shown in the portion between $t_1$ and $t_2$ in FIG. 1. This corresponds to generally a half cycle of the natural vibration cycle $T_1$ of the volume velocity of the ink shown by a thick solid line.

At the time t2 when the volume velocity of the ink in the nozzle 3 infinitely approaches 0, the driving voltage $V_P$ is charged ($V_P$=$+V_L$) to a second voltage ($+V_L$) of the same direction as the direction of polarization for contracting the active region 15 in the plane direction, thereby deflecting the piezoelectric deformation region 8 so as to protrude in the direction of the pressurizing chamber 2.

Thus, the volume of the pressurizing chamber 2 is reduced due to the deflection of the piezoelectric deformation region 8 in the direction of the pressurizing chamber 2 so that the pressure of the ink extruded from the pressurizing chamber 2 is applied to the ink in the nozzle 3 going to return in the direction of the distal end of the nozzle 3 contrarily to the state where the ink meniscus is most remarkably drawn into the pressurizing chamber 2 (the state where the volume velocity is 0 at the time $t_2$). As a result, the ink in the nozzle 3 is accelerated in the direction of the distal end of the nozzle 3 to remarkably protrude outward from the nozzle 3. At this time, the volume velocity of the ink in the nozzle 3 is temporarily increased toward the (+) side and thereafter gradually reduced to finally approach 0, as shown in the portion between $t_2$ and $t_3$ in FIG. 1. Thus, the aforementioned ink column is formed.

At the time ($t_3$ in FIG. 1) when the volume velocity of the ink protruding outward from the nozzle 3 infinitely approaches 0, the driving voltage $V_P$ is charged ($V_P$=$-V_L$) to the first voltage ($-V_L$) again for expanding the active region 15 in the plane direction, thereby deflecting the piezoelectric deformation region 8 in the direction opposite to the pressurizing chamber 2. Thus, a negative pressure formed by deflecting the piezoelectric deformation region 8 in the direction opposite to the pressurizing chamber 2 and increasing the volume of the pressurizing chamber 2 again is applied to the ink going to return into the pressurizing chamber 2 contrarily to the state most remarkably protruding outward of the nozzle 3 (the state where the volume velocity is 0 at the time $t_3$). As a result, the ink column extending from the nozzle 3 to the utmost is cut off to form a first ink droplet.

After the ink column is cut off, the ink in the nozzle 3 is drawn into the pressurizing chamber 2 again. At this time, the volume velocity of the ink in the nozzle 3 is temporarily increased toward the (−) side and thereafter gradually reduced to finally approach 0, as shown in the portion between $t_3$ and $T_4$ in FIG. 1. This corresponds to generally a half cycle of the natural vibration cycle $T_1$ of the volume velocity of the ink, as hereinabove described.

At the time $t_4$ when the volume velocity of the ink in the nozzle 3 infinitely approaches 0, the driving voltage $V_P$ is charged ($V_P=+V_L$) to the second voltage ($+V_L$) again for contracting the active region 15 in the plane direction, thereby deflecting the piezoelectric deformation region 8 in the direction of the pressurizing chamber 2. Thus, the ink remarkably protrudes outward from the nozzle 3 again to form an ink column, due to the same mechanism as that of the aforementioned behavior of the ink between the times $t_2$ and $t_3$. At this time, the volume velocity of the ink in the nozzle 3 is temporarily increased toward the (+) side and thereafter gradually reduced to finally approach 0, as shown in the portion between $t_4$ and $t_5$ in FIG. 1.

After the time ($t_5$ in FIG. 1) when the volume velocity of the ink in the nozzle 3 reaches 0, the speed of vibration of the ink is directed toward the pressurizing chamber 2, whereby the ink column extending from the nozzle 3 to the utmost is cut off to form a second ink droplet. The first and second ink droplets formed in this manner spatter onto the sheet surface opposed to the distal end of the nozzle 3 individually to form one dot.

The series of operations correspond to application of the driving voltage $V_P$ having the driving voltage waveform including two pulses each having a pulse width $T_2$ of about half of the natural vibration cycle $T_1$ to the active region 15, as shown by the thick one-dot chain lines in FIG. 1. In order to form one dot with only one ink droplet, the driving voltage waveform may include only one pulse. In order to form one dot with not less than three ink droplets, the pulse may be generated by the frequency corresponding to the number of the ink droplets.

In a case of subsequently forming a next dot after termination of the series of operations, the operation starting from $t_1$ is repeated again. In a case of not forming the next dot, on the other hand, the apparatus is brought into the standby state not applying ($V_P=0$) the driving voltage $V_P$.

According to the driving method of this example, the inactive region 16 of the piezoelectric ceramic layer 6 corresponding to the restricted region 9 of the unimorphic piezoelectric actuator 7 can be prevented from gradual creep deformation by performing the series of operations.

In other words, the piezoelectric deformation region 8 of the piezoelectric actuator 7 is deflected in the respective directions opposite to the pressurizing chamber 2 and the direction of the pressurizing chamber 2 by applying the driving voltage waveform including the first voltage ($-V_L$) and the second voltage ($+V_L$) opposite in polarity to the first voltage and equivalent thereto in ejection of ink droplet. Accordingly, the active region 15 of the piezoelectric ceramic layer 6 can be not only contracted in the plane direction and released from the contraction similarly to the conventional piezoelectric actuator but also expanded in the plane direction. Therefore, the inactive region 16 surrounding the active region 15 can be prevented from gradual creep deformation.

Figure 11:
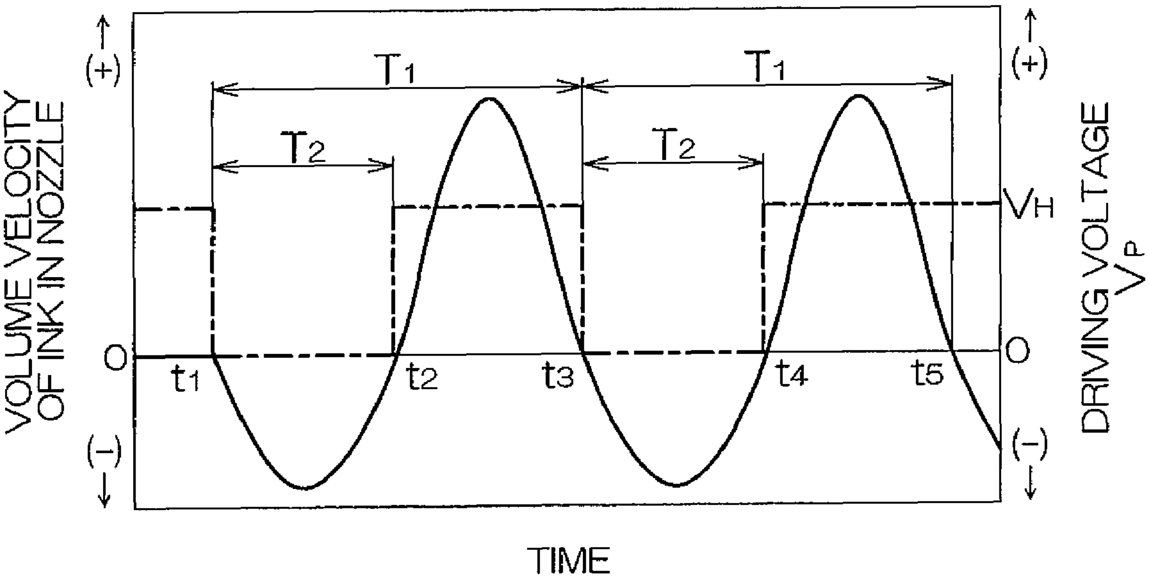
[FIG. 11] A graph showing the relation between an example of the driving voltage waveform of the driving voltage $V_P$ applied to the active region of the piezoelectric ceramic layer when the liquid ejector shown in FIG. 2 is driven by the conventional pull-push driving method and changes of the volume velocity of the ink in the nozzle upon application of this driving voltage waveform in a simplified manner.
Figure 12:
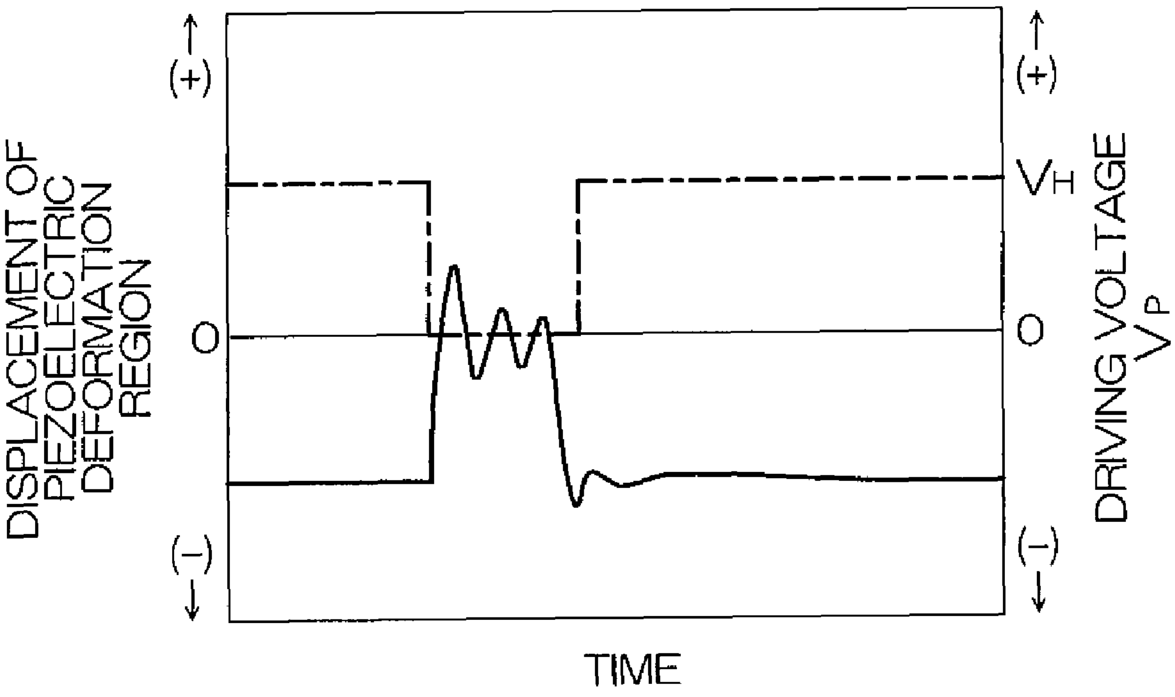
[FIG. 12] A graph showing the relation between the example of the driving voltage waveform of the driving voltage $V_P$ applied to the active region of the piezoelectric ceramic layer when the liquid ejector shown in FIG. 2 is driven by the pull-push driving method and the displacement of the piezoelectric deformation region of the piezoelectric actuator upon application of this driving voltage waveform in a simplified manner.

According to the driving method of this example, further, the displacement of the piezoelectric deformation region 8 in the thickness direction with respect to the stationary state of the piezoelectric actuator 7 not subjected to voltage application can be further reduced as compared with the prior art. In the driving method of this example, assuming that the displacement in the thickness direction between the stationary state ($V_P=0$) and the deflected state ($V_P=V_H$) in the conventional driving method shown in FIG. 11 is 1, the displacements for deflecting the piezoelectric deformation region 8 in the direction opposite to the pressurizing chamber 2 and the direction of the pressurizing chamber 2 for setting the total displacement of the piezoelectric deformation region 8 in the thickness direction identically to 1 in the driving method of this example can be each generally halved.

Therefore, stress in the plane direction applied to the inactive region 16 of the piezoelectric ceramic layer 6 upon deflection of the piezoelectric deformation region 8 can be further reduced. Therefore, the inactive region 16 can be more reliably prevented from creep deformation in combination that the stationary state is maintained applying no voltage to the piezoelectric deformation region 8 in the standby state not ejecting ink droplets.

In the driving method of this example, further, the displacement of the deflection of the piezoelectric deformation region 8 in the standby state can be generally halved as compared with the conventional one as hereinabove described. As a result, storage of elastic energy in the piezoelectric deformation region 8 in the standby state can be reduced and the shape of the piezoelectric deformation region 8 can be constrained by voltage application in both of the standby state and the driving state, thereby suppressing occurrence of noise vibration. Therefore, destabilization of ejection of ink droplets from the nozzle 3 corresponding to the piezoelectric deformation region 8 as well as destabilization of ejection of ink droplets from the nozzle 3 corresponding to the adjacent piezoelectric deformation region 8 resulting from occurrence of a crosstalk can be prevented.

According to the driving method of this example, therefore, the ink droplet ejection performance can be maintained at an excellent level over a long period by preventing gradual creep deformation of the inactive region 16 of the piezoelectric ceramic layer 6 corresponding to the restricted region 9 of the unimorphic piezoelectric actuator 7 and preventing destabilization of ejection of ink droplets resulting from noise vibration caused in the driving state of the piezoelectric deformation region 8.

According to the driving method of this example, further, the inactive region 16 of the piezoelectric ceramic layer 6 can be prevented from creep deformation as hereinabove described. As a result, the crystalline state of the inactive region 16 can be prevented from changing, and the crystalline state of the active region 15 can also be prevented from changing due to compressive stress received from the creep-deformed inactive region 16. Therefore, the crystalline states of both regions 15 and 16 of the piezoelectric ceramic layer 6 can be maintained in the initial states.

When the piezoelectric ceramic layer 6 is made of a PZT-type piezoelectric ceramic material, for example, both of the active region 15 and the inactive region 16 can be maintained so that the C-axis orientation $I_C$ showing the crystalline state of the ceramic material obtained from the intensity $I_{(200)}$ of the diffraction peak of the [200] plane and the intensity $I_{(002)}$ of the diffraction peak of the [002] plane in an X-ray diffraction spectrum by the following expression (1):

$$I_C=I_{(002)}/I_{(002)}+I_{(200)}) \quad (1)$$

is kept in the range of 1 to 1.1 times as that in the undriven initial state after driving.

In the driving method of this example as hereinabove described, when the displacements of the piezoelectric deformation region 8 in the direction opposite to the pressurizing chamber 2 and the direction of the pressurizing chamber 2 are each set to about half of the displacement in one direction in the conventional driving method, the absolute value of the first and second voltages $-V_L$ and $+V_L$ applied to the active region 15 of the piezoelectric ceramic layer 6 can also be set to about half of the absolute value of the driving voltage $V_H$ in the conventional driving method. Therefore, the insulating structure or the like can also be advantageously simplified by reducing the withstanding voltage value of the circuit reaching the electrodes 10 and 11 from the driving circuit 13. This is because the displacement of the deflection of the piezoelectric deformation region 8 in the thickness direction is proportionate to the value of the driving voltage applied to the active region 15 of the piezoelectric ceramic layer 6 in the unimorphic piezoelectric actuator 7 including the piezoelectric ceramic layer 6 imparted with the piezoelectric deformation properties of the transverse vibration mode in general.

The area of the P-E hysteresis loop showing the relation between the intensity of electric field E (kV/cm),and the polarization quantity P ($\mu C/cm^2$) of the piezoelectric ceramic layer 6 at the time of applying the driving voltage waveform to the piezoelectric deformation region 8 of the piezoelectric actuator 7 and driving the same is preferably set to not more than 1.3 times of the area of the P-E hysteresis loop of the conventional pull-push driving voltage wave shown in FIG. 11 and yet in the case where the driving voltage $V_H$ is twice of the value of the first voltage ($-V_L$) and the second voltage ($+V_L$). Thus, the hysteresis loss is so reduced that the piezoelectric deformation properties can be prevented from reduction resulting from depolarization of the piezoelectric ceramic layer 6 caused by self heating. Therefore, the ink droplet ejection performance can be maintained at an excellent level over a longer period.

In consideration of minimization of the hysteresis loss, the area of the P-E hysteresis loop is preferably set to not less than one time, more preferably 1.01 to 1.20 times of the area of the P-E hysteresis loop in the case of the conventional pull-push method. In order to adjust the area of the P-E hysteresis loop in the aforementioned range, the values of the first voltage ($-V_L$) and the second voltage ($+V_L$) are preferably minimized. More specifically, the area of the P-E hysteresis loop is abruptly increased when the first and second voltages are set to such values that the intensity of electric field E of the piezoelectric deformation region 8 of the piezoelectric actuator 7 exceeds the intensity of the coercive electric field Ec of the piezoelectric ceramic layer 6. Accordingly, the first and second voltages are preferably set to such values that the intensity of electric field E of the piezoelectric deformation region 8 of the piezoelectric actuator 7 is not more than the intensity of the coercive electric field Ec of the piezoelectric ceramic layer 6.

It is also effective to apply compressive stress to the entire piezoelectric ceramic layer 6 in order to adjust the area of the P-E hysteresis loop in the aforementioned range. In other words, polarization inversion is hardly caused when compressive stress is applied to the entire piezoelectric ceramic layer 6. Therefore, the area of the P-E hysteresis loop can be reduced by increasing the compressive stress if the electric field remains the same.

When the first and second voltages $-V_L$ and $+V_L$, are set to such values that the intensity of electric field E of the piezoelectric deformation region 8 of the piezoelectric actuator 7 is not more than 0.8 times, particularly 0.5 to 0.7 times of the intensity of the coercive electric field Ec of the piezoelectric ceramic layer 6, the aforementioned effect of preventing depolarization to prevent reduction of the piezoelectric deformation properties can be rendered more reliable. Therefore, the ink droplet ejection performance can be maintained at an excellent level over a longer period.

Figure 5:
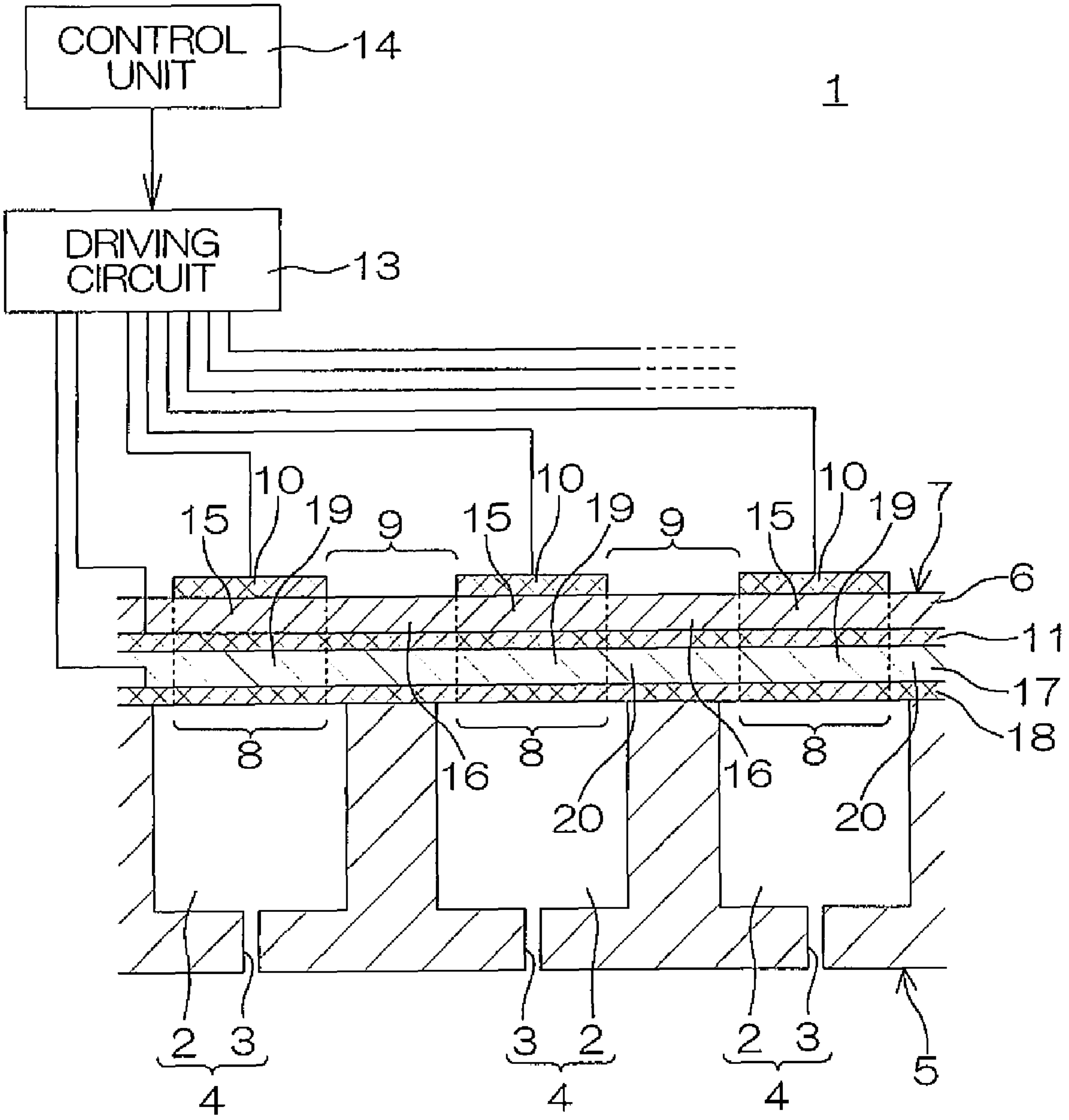
[FIG. 5] A sectional view showing the example of the liquid ejector including a bimorphic piezoelectric actuator.

FIG. 5 is a sectional view showing an example of a liquid ejector 1 including a bimorphic piezoelectric actuator 7. Referring to FIG. 5, the liquid ejector 1 of this example is identical in structure to the aforementioned liquid ejector 1 shown in FIG. 2 except the piezoelectric actuator 7. Therefore, identical portions are denoted by the same reference numerals, and description is omitted. The piezoelectric actuator 7 is divided into a plurality of piezoelectric deformation regions 8 arranged correspondingly to respective pressurizing chambers 2 and individually deflected in the thickness direction by individual voltage application and a restricted region 9 arranged to surround the piezoelectric deformation regions 8 and fixed to the substrate 5 to be prevented from deformation.

The piezoelectric actuator 7 includes a first piezoelectric ceramic layer 6 having a size covering the plurality of pressurizing chambers 2 arranged on the substrate 5 and individual electrodes 10 individually formed on the upper surface of the first piezoelectric ceramic layer 6 correspondingly to the respective pressurizing chambers 2 for defining the piezoelectric deformation regions 8, as well as a first common electrode 11, a second piezoelectric ceramic layer 17 and a second common electrode 18 successively laminated on the lower surface of the first piezoelectric ceramic layer 6 each having a size covering the plurality of pressurizing chambers 2, and has the bimorphic structure, as hereinabove described. The individual electrodes 10 and the first and second common electrodes 11 and 18 are separately connected to a driving circuit 13, and the driving circuit 13 is connected to control unit 14.

The first piezoelectric ceramic layer 6 is made of a piezoelectric material such as PZT, for example, and previously polarized in the layer thickness direction to have piezoelectric deformation properties of the transverse vibration mode. When the driving circuit 13 is driven by a control signal from the control unit 14 and a voltage of the same direction as the direction of the polarization is applied between an arbitrary individual electrode 10 and the first common electrode 11, an active region 15 corresponding to the piezoelectric deformation region 8 sandwiched between these electrodes 10 and 11 is contracted in the layer plane direction. When a voltage opposite to the direction of polarization is applied between the electrodes 10 and 11, on the other hand, the active region 15 is contrarily expanded in the layer plane direction.

On the other hand, the second piezoelectric ceramic layer 17 is similarly made of a piezoelectric material such as PZT, and previously polarized in the layer thickness direction to have piezoelectric deformation properties of the transverse vibration mode. Further, the second piezoelectric ceramic layer 17 is divided into active regions 19 corresponding to the piezoelectric deformation regions 8 contracted in the layer plane direction when the driving circuit 13 is driven by the control signal from the control unit 14 and the voltage of the same direction as the direction of the polarization is applied between the first and second common electrodes 11 and 18 and expanded in the layer plane direction when the voltage of the opposite direction is applied and an inactive region 20 fixed to the substrate 5 and restricted in expansion/contraction despite voltage application from the common electrodes 11 and 18.

When the voltage opposite to the direction of polarization is applied to the entire second piezoelectric ceramic layer 17 for expanding the active regions 19 in the plane direction synchronously with application of the voltage of the same direction as the direction of the polarization between an arbitrary individual electrode 10 of the first piezoelectric ceramic layer 6 and the first common electrode 11 for contracting the corresponding active region 15 in the plane direction in the bimorphic piezoelectric actuator 7, the piezoelectric deformation region 8 of the piezoelectric actuator 7 is deflected so as to protrude in the direction of the pressurizing chamber 2 accordingly.

When the voltage of the same direction as the direction of polarization is applied to the entire second piezoelectric ceramic layer 17 for contracting the active regions 19 in the plane direction synchronously with application of the voltage opposite to the direction of polarization between an arbitrary individual electrode 10 of the first piezoelectric ceramic layer 6 and the first common electrode 11 for expanding the corresponding active region 15 in the plane direction, on the other hand, the piezoelectric deformation region 8 of the piezoelectric actuator 7 is deflected so as to protrude oppositely to the pressurizing chamber 2 accordingly. Therefore, ink filled in the pressurizing chamber 2 can be vibrated and ejected through the nozzle 3 as ink droplets by repeating the deflection of the piezoelectric deformation region 8 in the direction of the pressurizing chamber 2 and in the direction opposite thereto.

Figure 4:
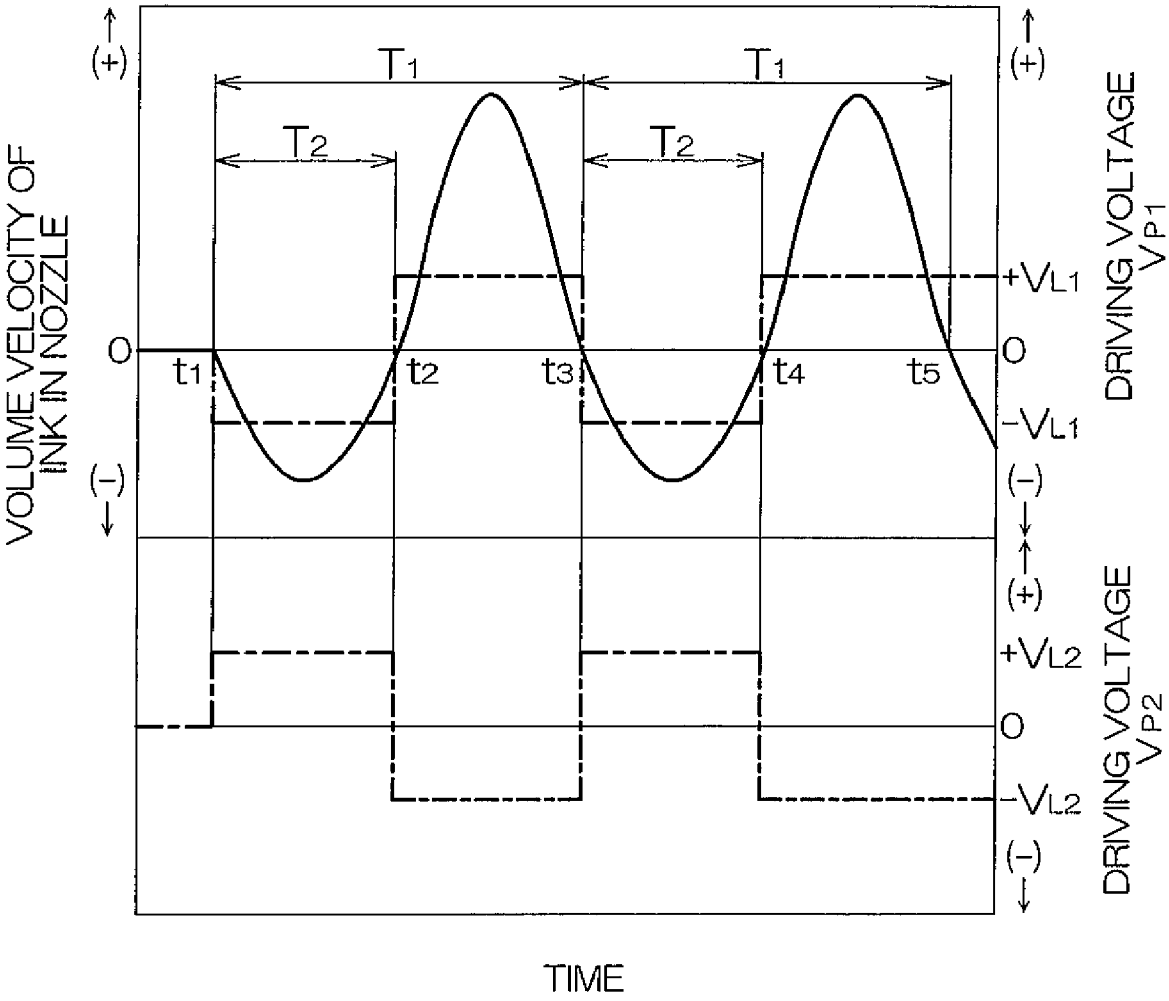
[FIG. 4] A graph showing the relation between examples of the driving voltage waveform of a driving voltage $V_{P1}$ applied to an active region of a first piezoelectric ceramic layer and the driving voltage waveform of a driving voltage $V_{P2}$ applied to an active region of a second piezoelectric ceramic layer when a liquid ejector of an example shown in FIG. 5 is driven by the driving method according to the present invention and changes of the volume velocity of ink in a nozzle upon application of these driving voltage waveforms in a simplified manner.

FIG. 4 is a graph showing the relation between examples of the driving voltage waveform (shown by thick one-dot chain lines in the upper stage of FIG. 4) of a driving voltage $V_{P1}$ applied to the active region 15 of the first piezoelectric ceramic layer 6 and the driving voltage waveform (shown by thick one-dot chain lines in the lower stage of FIG. 4) of a driving voltage $V_{P2}$ applied to the second piezoelectric ceramic layer 17 when the liquid ejector 1 of the example shown in FIG. 5 is driven by the driving method according to the present invention and changes of the volume velocity of the ink in the nozzle 3 upon application of these driving voltage waveforms in a simplified manner.

Referring to FIGS. 4 and 5, in the standby state on the left side of $t_1$ in FIG. 4 not ejecting ink droplets from the nozzle 3, a state not applying the driving voltages $V_{p1}$ and $V_{P2}$ ($V_{P1}=0$, $V_{P2}=0$) and releasing the piezoelectric deformation region 8 from deflection is maintained while the ink remains in a stationary state, i.e., the volume velocity of the ink in the nozzle 3 is maintained at 0, and an ink meniscus formed in the nozzle 3 by the surface tension of the ink remains stationary.

In order to eject ink droplets from the nozzle 3 and form dots on a sheet surface, the driving voltage $V_{P1}$ is charged ($V_{P1}=-V_{L1}$) to a first voltage ($-V_{L1}$) opposite to the direction of polarization at the preceding time $t_1$ for expanding the active region 15 in the plane direction while the driving voltage $V_{P2}$ is charged ($V_{P2}=+V_{L2}$) to a first voltage ($+V_{L2}$) of the same direction as the direction of polarization for contracting the active region 19 in the plane direction, thereby deflecting the piezoelectric deformation region 8 in the direction opposite to the pressurizing chamber 2.

Thus, the volume of the pressurizing chamber 2 is increased by a certain amount, whereby the ink meniscus in the nozzle 3 is drawn into the pressurizing chamber 2 by this increment of the volume. At this time, the volume velocity of the ink in the nozzle 3 is temporarily increased toward the (−) side and thereafter gradually reduced to finally approach 0, as shown in the portion between $t_1$ and $t_2$ in FIG. 4.

At the time $t_2$ when the volume velocity of the ink in the nozzle 3 infinitely approaches 0, the driving voltage $V_{P1}$ is charged ($V_{P1}=+V_{L1}$) to a second voltage ($+V_{L1}$) of the same direction as the direction of polarization for contracting the active region 15 in the plane direction while the driving voltage $V_{P2}$ is charged ($V_{P2}=-V_{L2}$) to a second voltage ($-V_{L2}$) opposite to the direction of polarization for expanding the active region 19 in the plane direction, thereby deflecting the piezoelectric deformation region 8 to protrude in the direction of the pressurizing chamber 2.

Thus, the volume of the pressurizing chamber 2 is reduced due to the deflection of the piezoelectric deformation region 8 in the direction of the pressurizing chamber 2 so that the pressure of the ink extruded from the pressurizing chamber 2 is applied to the ink in the nozzle 3 going to return in the direction of the distal end of the nozzle 3 contrarily to the state where the ink meniscus is most remarkably drawn into the pressurizing chamber 2 (the state where the volume velocity is 0 at the time $t_2$). Thus, the ink in the nozzle 3 is accelerated in the direction of the distal end of the nozzle 3 to remarkably protrude outward from the nozzle 3. At this time, the volume velocity of the ink in the nozzle 3 is temporarily increased toward the (+) side and thereafter gradually reduced to finally approach 0, as shown in the portion between $t_2$ and $t_3$ in FIG. 4. Thus, the aforementioned ink column is formed.

At the time ($t_3$ in FIG. 4) when the volume velocity of the ink protruding outward from the nozzle 3 infinitely approaches 0, the driving voltage $V_{P1}$ is charged ($V_{P1}=-V_{L1}$) to the first voltage ($-V_{L1}$) again for expanding the active region 15 in the plane direction while the driving voltage $V_{P2}$ is charged ($V_{P2}=+V_{L2}$) to the first voltage ($+V_{L2}$) again for contracting the active region 19 in the plane direction, thereby deflecting the piezoelectric deformation region 8 in the direction opposite to the pressurizing chamber 2.

Thus, a negative pressure formed by deflecting the piezoelectric deformation region 8 in the direction opposite to the pressurizing chamber 2 and increasing the volume of the pressurizing chamber 2 again is applied to the ink going to return into the pressurizing chamber 2 contrarily to the state most remarkably protruding outward of the nozzle 3 (the state where the volume velocity is 0 at the time $t_3$), whereby the ink column extending from the nozzle 3 to the utmost is cut off to form a first ink droplet. After the ink column is cut off, the ink in the nozzle 3 is drawn into the pressurizing chamber 2 again. At this time, the volume velocity of the ink in the nozzle 3 is temporarily increased toward the (−) side and thereafter gradually reduced to finally approach 0, as shown in the portion between $t_3$ and $T_4$ in FIG. 4.

At the time $t_4$ when the volume velocity of the ink in the nozzle 3 infinitely approaches 0, the driving voltage $V_{P1}$ is charged ($V_{P1}=+V_{L1}$) to the second voltage ($+V_{L1}$) again for contracting the active region 15 in the plane direction while the driving voltage $V_{P2}$ is charged ($V_{P2}=-V_{L2}$) to the second voltage ($-V_{L2}$) again for expanding the active region 19 in the plane direction, thereby deflecting the piezoelectric deformation region 8 in the direction of the pressurizing chamber 2. Thus, the ink remarkably protrudes outward from the nozzle 3 again to form an ink column, due to the same mechanism as that of the aforementioned behavior of the ink between the times $t_2$ and $t_3$. At this time, the volume velocity of the ink in the nozzle 3 is temporarily increased toward the (+) side and thereafter gradually reduced to finally approach 0, as shown in the portion between $t_4$ and $t_5$ in FIG. 4.

After the time ($t_5$ in FIG. 4) when the volume velocity of the ink in the nozzle 3 reaches 0, the speed of vibration of the ink is directed toward the pressurizing chamber 2, whereby the ink column extending from the nozzle 3 to the utmost is cut off to form a second ink droplet. The first and second ink droplets formed in this manner spatter onto the sheet surface opposed to the distal end of the nozzle 3 individually, to form one dot.

The series of operations correspond to application of the driving voltage $V_{P1}$ having the driving voltage waveform including two pulses each having a pulse width $T_2$ of about half of the natural vibration cycle $T_1$ to the active region 15 while applying the driving voltage $V_{P2}$ having an antiphase driving voltage waveform synchronous therewith to the second piezoelectric ceramic layer 17, as shown by thick one-dot chain lines in FIG. 4. In order to form one dot with only one ink droplet, the driving voltage waveform may include only one pulse. In order to form one dot with not less than three ink droplets, the pulse may be generated by the frequency corresponding to the number of the ink droplets. In a case of subsequently forming a next dot after termination of the series of operations, the operation starting from $t_1$ is repeated again. In a case of not forming the next dot, on the other hand, the apparatus is brought into the standby state not applying both of the driving voltages $V_{p1}$ and $V_{P2}$ ($V_{P1}$=0, $V_{P2}$=0).

According to the driving method of this example, the inactive region 16 of the first piezoelectric ceramic layer 6 and the inactive region 20 of the second piezoelectric ceramic layer 17 corresponding to the restricted region 9 of the bimorphic piezoelectric actuator 7 each can be prevented from gradual deformation by performing the series of operations.

Similarly to the aforementioned case of the unimorphic piezoelectric actuator 7, plane-directional stress applied to both inactive regions 16 and 20 upon deflection of the piezoelectric deformation region 8 can be reduced as compared with the conventional one by setting the displacements for deflecting the piezoelectric deformation region 8 in the direction opposite to the pressurizing chamber 2 and the direction of the pressurizing chamber 2 with respect to the stationary state applying no voltage to about half of that in the conventional method for driving the bimorphic piezoelectric actuator 7. As a result, the inactive regions 16 and 20 can be more reliably prevented from creep deformation in combination that the stationary state is maintained applying no voltage to the piezoelectric deformation region 8 in the standby state not ejecting ink droplets.

Further, the displacement of the deflection of the piezoelectric deformation region 8 in the standby state can be generally halved as compared with the conventional one. As a result, storage of elastic energy in the piezoelectric deformation region 8 in the standby state can be reduced and the shape of the piezoelectric deformation region 8 can be constrained by voltage application in both of the standby state and the driving state, thereby suppressing occurrence of noise vibration. Therefore, destabilization of ejection of ink droplets from the nozzle 3 corresponding to the piezoelectric deformation region 8 as well as destabilization of ejection of ink droplets from the nozzle 3 corresponding to the adjacent piezoelectric deformation region 8 resulting from occurrence of a crosstalk can be prevented.

According to the driving method of this example, therefore, the ink droplet ejection performance can be maintained at an excellent level over a long period by preventing gradual creep deformation of the inactive region 16 of the first piezoelectric ceramic layer 6 and the inactive region 20 of the second piezoelectric ceramic layer 17 corresponding to,the restricted region 9 of the bimorphic piezoelectric actuator 7 and preventing destabilization of ejection of ink droplets resulting from noise vibration caused in the driving state of the piezoelectric deformation region 8.

When both of the first and second piezoelectric ceramic layers 6 and 17 are made of a PZT-type piezoelectric ceramic material, for example, the crystalline states of all of the active regions 15 and 19 and the inactive regions 16 and 20 can be maintained so that the C-axis orientation $I_C$ showing the crystalline state of the ceramic material obtained from the intensity $I_{(200)}$ of the diffraction peak of the [200] plane and the intensity $I_{(002)}$ of the diffraction peak of the [002] plane in the X-ray diffraction spectrum by the following expression (1):

$$I_C = I_{(002)}/(I_{(002)}+I_{(200)}) \tag{1}$$

is kept in the range of 1 to 1.1 times as that in the undriven initial state after driving according to the driving method of this example.

When the displacements of the piezoelectric deformation region 8 in the direction opposite to the pressurizing chamber 2 and the direction of the pressurizing chamber 2 are each set to about half of the displacement in one direction in the conventional driving method, the absolute values of the first and second voltages $-V_{L1}$ and $+V_{L1}$ applied to the active region 15 of the first piezoelectric ceramic layer 6 and the absolute values of the first and second voltages $+V_{L2}$ and $-V_{L2}$ applied to the second piezoelectric ceramic layer 17 can be set to about half of the driving voltage value in the conventional driving method. Therefore, the insulating structure or the like can also be advantageously simplified by reducing the withstanding voltage value of the circuit reaching the electrodes 10, 11 and 18 from the driving circuit 13. The reason for this is similar to that in the case of the aforementioned unimorphic piezoelectric actuator 7. In other words, the displacement of the deflection of the piezoelectric deformation region 8 in the thickness direction is proportionate to the values of the driving voltages applied to the active region 15 of the first piezoelectric ceramic layer 6 and the second piezoelectric ceramic layer 17.

In the bimorphic piezoelectric actuator 7, the values of the respective driving voltages applied to the first and second piezoelectric ceramic layers 6 and 17 can be set to about half of the value of the driving voltage applied to the piezoelectric ceramic layer of the unimorphic piezoelectric actuator having the piezoelectric deformation region set to the same displacement. According to the driving method of this example, therefore, the absolute values of the respective voltages $-V_{L1}$, $+V_{L1}$, $+V_{L2}$ and $-V_{L2}$ can be set to about ¼ of each driving voltage value $V_H$ in the conventional driving method for the unimorphic piezoelectric actuator shown in FIG. 11.

Further, the first and second piezoelectric ceramic layers 6 and 17 can be prevented from depolarization for preventing reduction of the piezoelectric deformation properties by setting the area of the P-E hysteresis loop showing the relation between the intensity of electric field E (kV/cm) and the polarization quantity P (μC/cm$^2$) of the piezoelectric ceramic layer at the time of applying the driving voltage waveform to the piezoelectric deformation region 8 of the piezoelectric actuator 7 for driving the same to not more than 1.3 times of the area of the P-E hysteresis loop of the conventional pull-push driving voltage waveform (applied to the first piezoelectric ceramic layer 6) shown in FIG. 11 and an antiphase driving voltage waveform (applied to the second piezoelectric ceramic layer 17, not shown) in the case where the driving voltage $V_H$ is twice of the values of the respective voltages $-V_{L1}$, $+V_{L1}$, $-V_{L2}$ and $+V_{L2}$.

In consideration of minimization of the hysteresis loss, the area of the P-E hysteresis loop is preferably set to not less than one time, more preferably 1.01 to 1.20 times of the area of the P-E hysteresis loop in the case of the conventional pull-push method. In order to adjust the area of the P-E hysteresis loop in the aforementioned range, the respective voltages $-V_{L1}$, $+V_{L1}$, $-V_{L2}$ and $+V_{L2}$ are preferably set to such values that the intensity of electric field E of the piezoelectric deformation region 8 of the piezoelectric actuator 7 is smaller than the intensity of the coercive electric field Ec of the piezoelectric ceramic layer 6, more preferably not more than 0.8 times, particularly preferably 0.5 to 0.7 times of the intensity of the coercive electric field of the piezoelectric ceramic layer 6.

Figure 6:
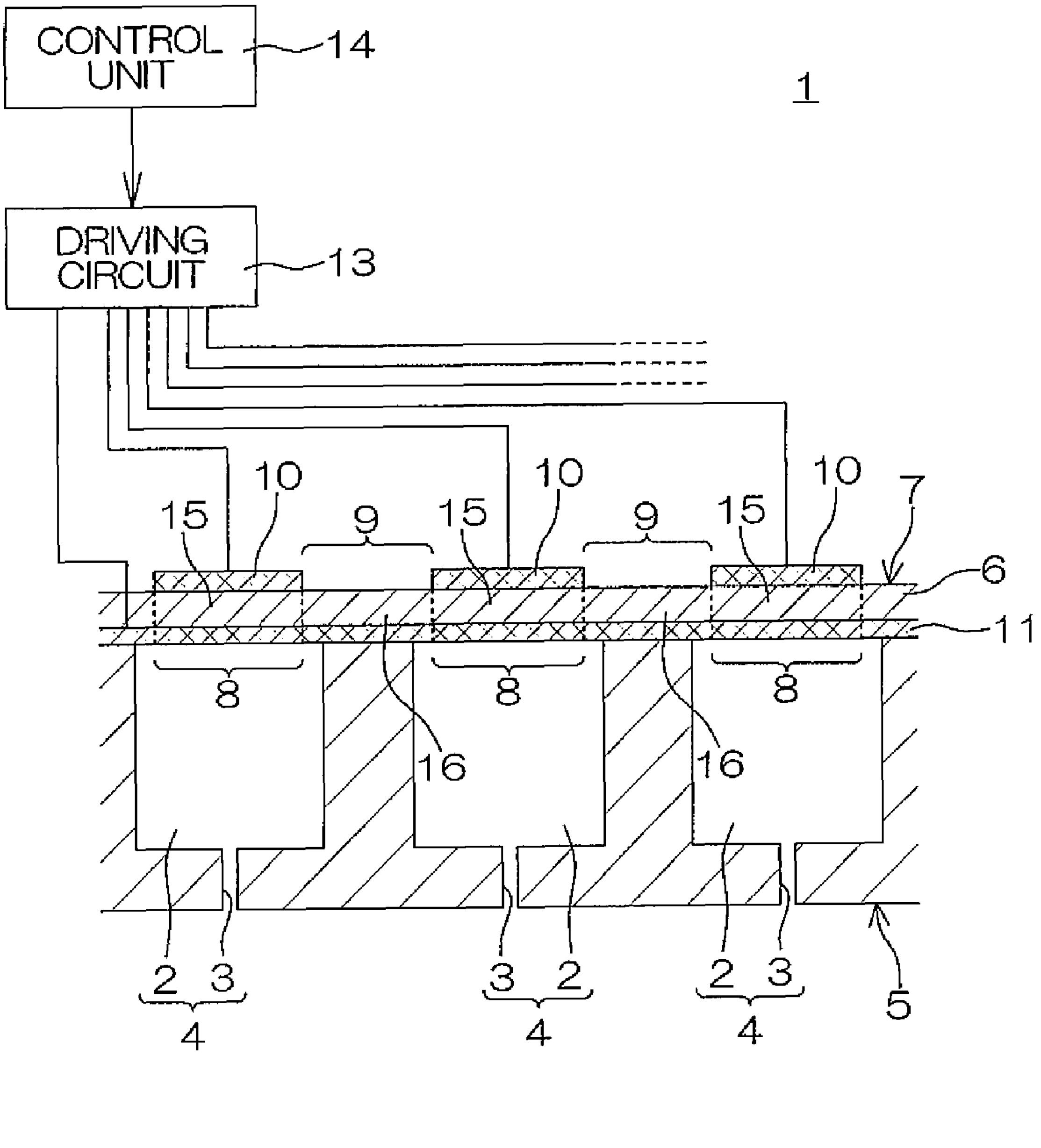
[FIG. 6] A sectional view showing an example of a liquid ejector including a monomorphic piezoelectric actuator.

FIG. 6 is a sectional view showing an example of a liquid ejector 1 including a monomorphic piezoelectric actuator 7. Referring to FIG. 6, the liquid ejector 1 of this example is identical in structure to the aforementioned liquid ejector 1 shown in FIG. 2 except the piezoelectric actuator 7. Therefore, identical portions are denoted by the same reference numerals, and description is omitted. The piezoelectric actuator 7 is divided into a plurality of piezoelectric deformation regions 8 arranged correspondingly to respective pressurizing chambers 2 and individually deflected in the thickness direction by individual voltage application and a restricted region 9 arranged to surround the piezoelectric deformation regions 8 and fixed to the substrate 5 to be prevented from deformation.

The piezoelectric actuator 7 includes a piezoelectric ceramic layer 6 having a size covering the plurality of pressurizing chambers 2 arranged on the substrate 5, individual electrodes 10 individually formed on the upper surface of the piezoelectric ceramic layer 6 correspondingly to the respective pressurizing chambers 2 for defining the piezoelectric deformation regions 8 and a common electrode 11 having a size covering the plurality of pressurizing chambers 2 formed on the lower surface of the piezoelectric ceramic layer 6, and has a monomorphic structure, as hereinabove described.

In other words, the piezoelectric actuator 7 is so formed that each piezoelectric deformation region 8 can be deflected in both of the direction opposite to the pressurizing chamber 2 and the direction of the pressurizing chamber 2 in accordance with the direction of a voltage applied to the piezoelectric ceramic layer 6 through the electrodes 10 and without laminating a oscillator plate or a second piezoelectric ceramic layer by preparing the piezoelectric ceramic layer 6 from a gradient function material or by utilizing a semiconductor effect. In the monomorphic piezoelectric actuator 7, the piezoelectric deformation region 8 can be vibrated similarly to that of the unimorphic piezoelectric actuator 7 shown in FIG. 2 by applying the driving voltage $V_P$ having the driving voltage waveform shown in FIG. 1 when the gradient direction of the function material is selected, for example.

In other words, the driving voltage $V_P$ is not applied ($V_P=0$) but the piezoelectric deformation region 8 is kept released from deflection in the standby state on the left side of $t_1$ in FIG. 1, the driving voltage $V_P$ is charged ($V_P=-V_L$) to the first voltage ($-V_L$) at the time $t_1$ for deflecting the piezoelectric deformation region 8 in the direction opposite to the pressurizing chamber 2 to start vibration of ink in the pressurizing chamber 2. Thus, the driving voltage $V_P$ is charged ($V_P=+V_L$) to the second voltage ($+V_L$) at the time $t_2$ for deflecting the piezoelectric deformation region 8 to protrude in the direction of the pressurizing chamber 2 thereby forming an ink column. The driving voltage $V_P$ is thereafter charged ($V_P=-V_L$) to the first voltage ($-V_L$) again at the time $t_3$ for deflecting the piezoelectric deformation region 8 in the direction opposite to the pressurizing chamber 2, whereby the ink column extending from a nozzle 3 to the utmost is cut off to form a first ink droplet.

When the driving voltage $V_P$ is charged ($V_P=+V_L$) to the second voltage ($+V_L$) again at the time $t_4$ for deflecting the piezoelectric deformation region 8 in the direction of the pressurizing chamber 2 and forming another ink column, the speed of vibration of the ink is directed toward the pressurizing chamber 2 after the time $t_5$, whereby the ink column extending from the nozzle 3 to the utmost is cut off to form a second ink droplet. The first and second ink droplets formed in this manner spatter onto a sheet surface opposed to the distal end of the nozzle 3 individually to form one dot.

The series of operations correspond to application of the driving voltage $V_P$ having the driving voltage waveform including two pulses each having a pulse width $T_2$ of about half of the natural vibration cycle $T_1$ to the active region 15, as shown by the thick one-dot chain lines in FIG. 1. In order to form one dot with only one ink droplet, the driving voltage waveform may include only one pulse. In order to form one dot with not less than three ink droplets, the pulse may be generated by the frequency corresponding to the number of the ink droplets. In a case of subsequently forming a next dot after termination of the series of operations, the operation starting from $t_1$ is repeated again. In a case of not forming the next dot, on the other hand, the apparatus is brought into the standby state not applying ($V_P=0$) the driving voltage $V_P$.

According to the driving method of this example, performing the series of operations can maintain the ink droplet ejection performance at an excellent level by preventing the inactive region 16 of the piezoelectric ceramic layer 6 corresponding to the restricted region 9 of the monomorphic piezoelectric actuator 7 from such gradual creep deformation that the area of the inactive region 16 in the thickness direction corresponding to the protruding side of the active region 15 is compressed in the plane direction and the opposite area is expanded in the plane direction.

Similarly to the aforementioned cases of the unimorphic and bimorphic piezoelectric actuators, plane-directional stress applied to each inactive region 16 upon deflection of the piezoelectric deformation region 8 can be reduced as compared with the prior art by setting the displacements for deflecting the piezoelectric deformation region 8 in the direction opposite to the pressurizing chamber 2 and the direction of the pressurizing chamber 2 with respect to the stationary state applying no voltage to about half as that in the conventional method for driving the monomorphic piezoelectric actuator 7. As a result, each inactive region 16 can be more reliably prevented from creep deformation in combination that the stationary state is maintained applying no voltage to the piezoelectric deformation region 8 in the standby state not ejecting ink droplets.

Further, the displacement of the deflection of the piezoelectric deformation region 8 in the standby state can be generally halved as compared with the conventional one. As a result, storage of elastic energy in the piezoelectric deformation region 8 in the standby state can be reduced and the shape of the piezoelectric deformation region 8 can be constrained by voltage application in both of the standby state and the driving state, thereby suppressing occurrence of noise vibration. Therefore, destabilization of ejection of ink droplets from the nozzle 3 corresponding to the piezoelectric deformation region 8 as well as destabilization of ejection of ink droplets from the nozzle 3 corresponding to the adjacent piezoelectric deformation region 8 resulting from occurrence of a crosstalk can be prevented.

According to the driving method of this example, therefore, the ink droplet ejection performance can be maintained at an excellent level over a long period by preventing gradual creep deformation of each inactive region 16 of the piezoelectric ceramic layer 6 corresponding to the restricted region 9 of the monomorphic piezoelectric actuator 7 and preventing destabilization of ejection of ink droplets resulting from noise vibration caused in the driving state of the piezoelectric deformation region 8.

When the piezoelectric ceramic layer 6 is made of a HT-type piezoelectric ceramic material, for example, the crystalline states of both of the active region 15 and the inactive region 16 can be maintained so that the C-axis orientation $I_C$ showing the crystalline state of the ceramic material obtained from the intensity $I_{(200)}$ of the diffraction peak of the [200] plane and the intensity $I_{(002)}$ of the diffraction peak of the [002] plane in the X-ray diffraction spectrum by the following expression (1):

$$I_C=I_{(002)}/I_{(002)}+I_{(200)}) \quad (1)$$

is kept in the range of 1 to 1.1 times as that in the undriven initial state after driving according to the driving method of this example.

When the displacements of the piezoelectric deformation region 8 in the direction opposite to the pressurizing chamber 2 and the direction of the pressurizing chamber 2 are each set to about half of the displacement in one direction in the conventional driving method, the absolute values of the first and second voltages $-V_L$ and $+V_L$ applied to the active region 15 of the piezoelectric ceramic layer 6 can be set to about half of the driving voltage value in the conventional method for driving the monomorphic piezoelectric actuator 7. Therefore, the insulating structure or the like can also be advantageously simplified by reducing the withstanding voltage value of the circuit reaching the electrodes 10 and 11 from the driving circuit 13.

The structure of the present invention is not limited to the example shown in each drawing described above. Referring to the unimorphic piezoelectric actuator 7 shown in FIG. 2, for example, the driving voltage waveform applied to the active region 15 of the piezoelectric ceramic layer 6 may be formed by simply changing the voltage $V_H$ in the conventional pull-push driving method to the second voltage $+V_L$ and changing 0 V to the first voltage $-V_L$.

In this case, the active region 15 of the piezoelectric ceramic layer 6 is so continuously contracted by application of the second voltage $+V_L$ that the inactive region 16 around the same is creep-deformed to be expanded in the plane direction in the standby state, while this creep deformation of the inactive region 16 can be canceled by applying the first voltage $-V_L$ in ejection of ink droplets for forcibly expanding the active region 15. When the absolute value of the second voltage $+V_L$ is set to about half of the voltage $V_H$, the amount of the creep deformation itself can be reduced.

In addition, occurrence of noise vibration can be suppressed by reducing the displacement of the deflection of the piezoelectric deformation region 8 as compared with the conventional one for reducing storage of elastic energy in the piezoelectric deformation region 8 in the standby state while constraining the shape of the piezoelectric deformation region 8 in both in the standby state and the driving state. Therefore, the ink droplet ejection performance can be maintained at an excellent level over a long period by preventing the inactive region of the piezoelectric ceramic layer surrounding the active regions from gradual creep deformation and preventing destabilization of ejection of ink droplets resulting from noise vibration caused in the driving state of the piezoelectric deformation region. Further, various modifications can be introduced in the range not departing from the subject matter of the present invention.

Examples

Example 1

(Preparation of Piezoelectric Actuator)

Slurry was prepared by blending piezoelectric ceramic powder mainly composed of lead zirconate titanate having a particle diameter of 0.5 to 3.0 μm with an acrylic resin emulsion and pure water and mixing these materials with nylon balls having an average particle diameter of 10 mm in a ball mill for 30 hours. Then, the slurry was employed for forming a green sheet having a thickness of 17 to 19 μm for forming a piezoelectric ceramic layer 6 and a oscillator plate 12 on a polyethylene terephthalate (PET) film having a thickness of 30 μm by the pull-up method.

Then, the green sheet was cut into two squares of 50 mm by 50 mm along with the PET film was prepared, metal paste for forming a common electrode 11 was screen-printed generally on the entire exposed surface of one of the green sheet, and the two green sheets were thereafter dried in an explosion-proof drier at 50° C. for 20 minutes. As the metal paste, a powder was prepared by mixing silver powder and palladium powder both having average particle diameters of 2 to 4 μm with each other at a weight ratio of 7:3. A through-hole for wiring to the common electrode 11 was formed in the other green sheet.

Then, the other green sheet was overlapped on the surface printed with the metal paste of the dried one green sheet in an aligned manner, and held at 60° C. for 60 seconds while applying a pressure of 5 MPa in the thickness direction for thermocompression-bonding the same to each other. Subsequently, the PET film was stripped off from both the green sheets and filling the metal paste identical to the above into the through-hole to form a laminate.

Then, the resin was removed from the laminate in a drier by increasing the temperature from 100° C. to 300° C. for 25 hours at a temperature rise speed of 8° C. per hour, and thereafter cooled to the room temperature. The laminate was further fired in a firing furnace at a peak temperature of 1100° C. for 2 hours, thereby obtaining a laminate of the piezoelectric ceramic layer 6, the common electrode 11 and the oscillator plate 12. Both of the thicknesses of the piezoelectric ceramic layer 6 and the oscillator plate 12 were 10 μm. The intensity of the coercive electric field of the piezoelectric ceramic layer 6 was 17 kV/cm.

Then, patterns corresponding to a plurality of individual electrodes 10 were printed on the exposed surface of the piezoelectric ceramic layer 6 of the laminate by screen printing using the metal paste identical to the above for forming the plurality of individual electrodes 10 by passing the laminate through a continuous furnace at a peak temperature of 850° C. for 30 minutes to bake the metal paste. The periphery of the laminate was thereafter cut with a dicing saw to have a rectangular contour of 33 mm by 12 mm. As patterns of individual electrode layers 25, two rows of 90 individual electrode layers 10 were arranged at a pitch of 254 μm along the longitudinal direction of the rectangle to form a unimorphic piezoelectric actuator 7.

(Preparation of Liquid Ejector)

A stainless steel foil having a thickness of 100 μm was punched with a mold press to form a first substrate having two rows each of 90 pressurizing chambers 2 of 2 mm by 0.18 mm arranged in correspondence with a forming pitch of the individual electrodes 10. Stainless steel foil having a thickness of 100 μm was likewise punched with a mold press to form a second substrate having a common supply path for supplying ink to the pressurizing chambers 2 from an ink supply section of an ink jet printer and passages connecting the pressurizing chambers 2 and nozzles 3 arranged correspondingly to the alignment of the pressurizing chambers 2. Still, stainless steel foil having a thickness of 40 μm was etched to form a third substrate having nozzles 3 having a diameter of 26 μm arranged correspondingly to the alignment of the pressurizing chambers 2.

The first to third substrates were bonded to one another using an adhesive to form a substrate 5. This substrate 5 and the previously prepared piezoelectric actuator 7 were bonded to each other using an adhesive. The respective individual electrodes 10 and exposed portions of an electrode layer agent filled in through-holes and connected to the common electrode 11 were connected to a driving circuit 13 with a flexible substrate to produce the liquid ejector 1 shown in FIG. 1.

(Durability Test)

Transition of displacements of a piezoelectric deformation region 8 of the piezoelectric actuator 7 was measured when the liquid ejector 1 produced in Example 1 was continuously driven by the driving method of the present invention and the conventional pull-push driving method using driving voltage waveforms generated by a high-speed bipolar power source and a function synthesizer.

In other words, the driving was stopped every certain driving cycle (a series of operations necessary for forming one dot on a sheet surface is assumed as one cycle) in the continuous driving. With vibrating the piezoelectric deformation region 8 by applying a sine wave having a frequency of 12 kHz, a vibration speed measured by applying a laser beam to the plane of vibration thereof using a laser Doppler vibration meter was integrated to obtain the displacement of the piezoelectric deformation region 8 at this time. The percentages were plotted in FIG. 7 that represented changes in the displacement of the piezoelectric deformation region 8 upon termination of specific driving cycles with respect to the displacement in the initial state (0 cycle) before starting the continuous driving.

The driving voltage waveform ($+V_L$=+10 V, $-V_L$=−10 V, driving frequency: 2 kHz) shown in FIG. 1 was applied to the piezoelectric deformation region 8 of the piezoelectric actuator 7 in the driving method according to the present invention, while the driving voltage waveform ($V_H$=+20 V, driving frequency: 2 kHz) shown in FIG. 11 was applied in the conventional pull-push driving method.

Figure 7:
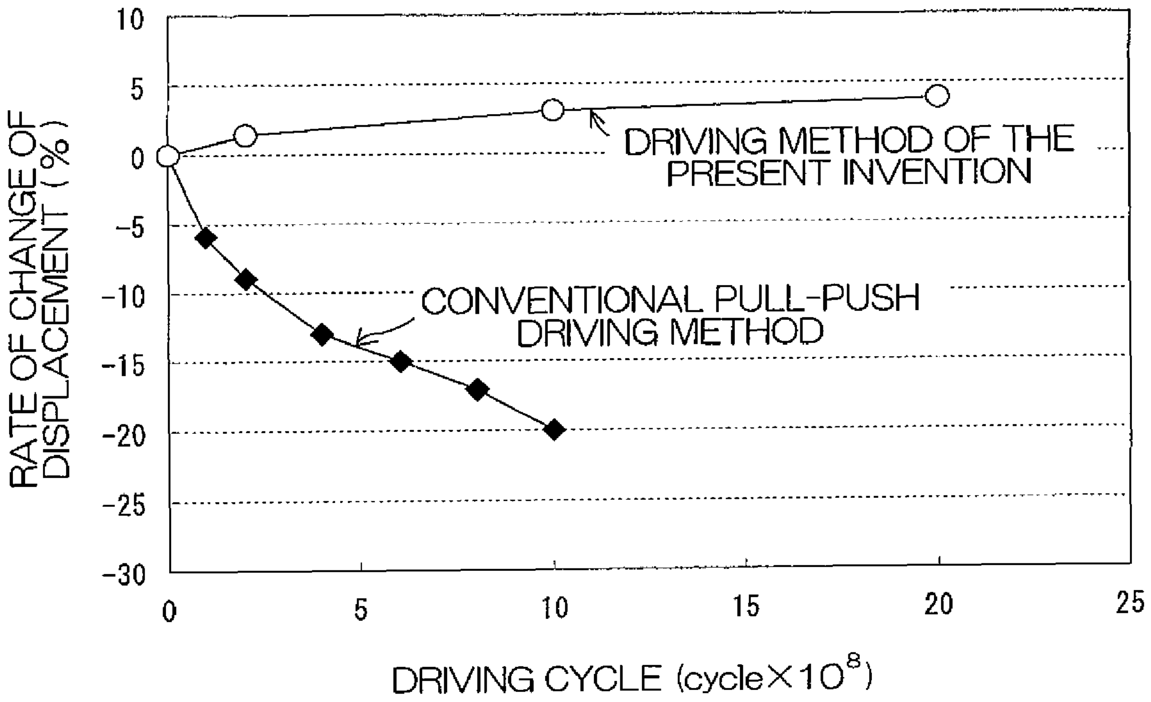
[FIG. 7] A graph showing results of measurement of driving lives in driving of a liquid ejector including a unimorphic piezoelectric actuator manufactured according to Example 1 of the present invention by the driving method according to the present invention and a conventional pull-push driving method.

The results showed that the displacement of the piezoelectric deformation region 8 was remarkably reduced in the period up to the $10\times10^8$ cycle in the driving by the conventional pull-push driving method, as shown in FIG. 7. On the other hand, the results confirmed that the displacement was absolutely not reduced but slightly increased to the contrary in the period up to the $20\times10^8$ cycle at which the measurement was terminated in the driving by the driving method according to the present invention.

(Voltage-Displacement Characteristic Test)

Figure 8:
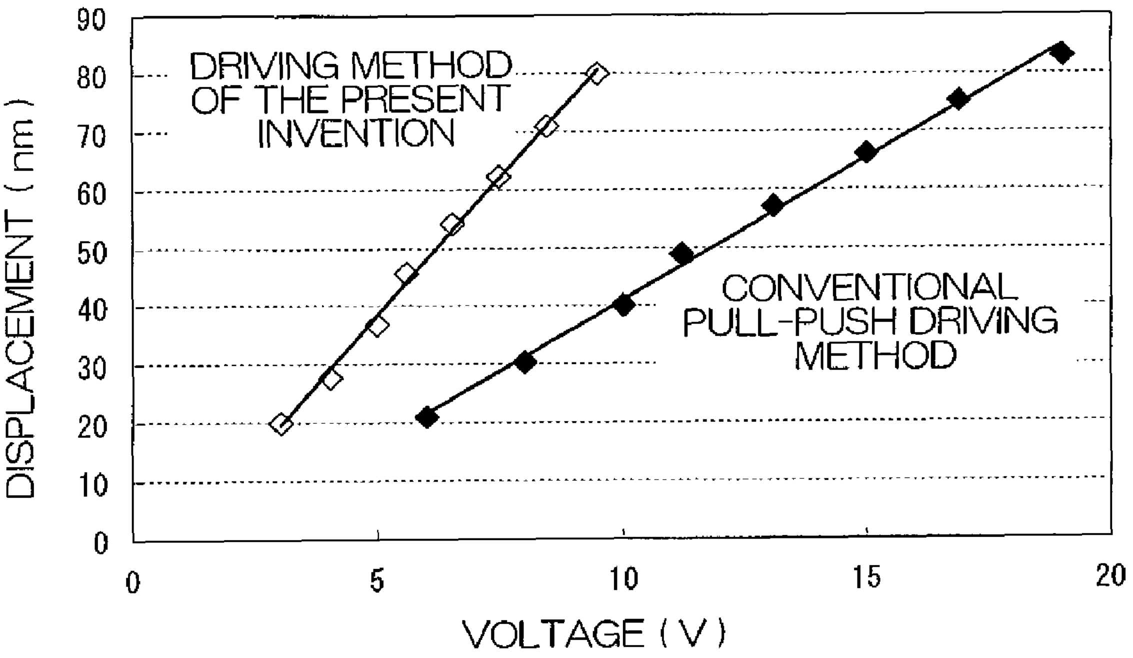
[FIG. 8] A graph showing the relation between displacements of a piezoelectric deformation region of the piezoelectric actuator in the thickness direction and applied voltages in driving of the liquid ejector manufactured according to the aforementioned Example 1 by the driving method according to the present invention and the conventional pull-push driving method.
Figure 9:
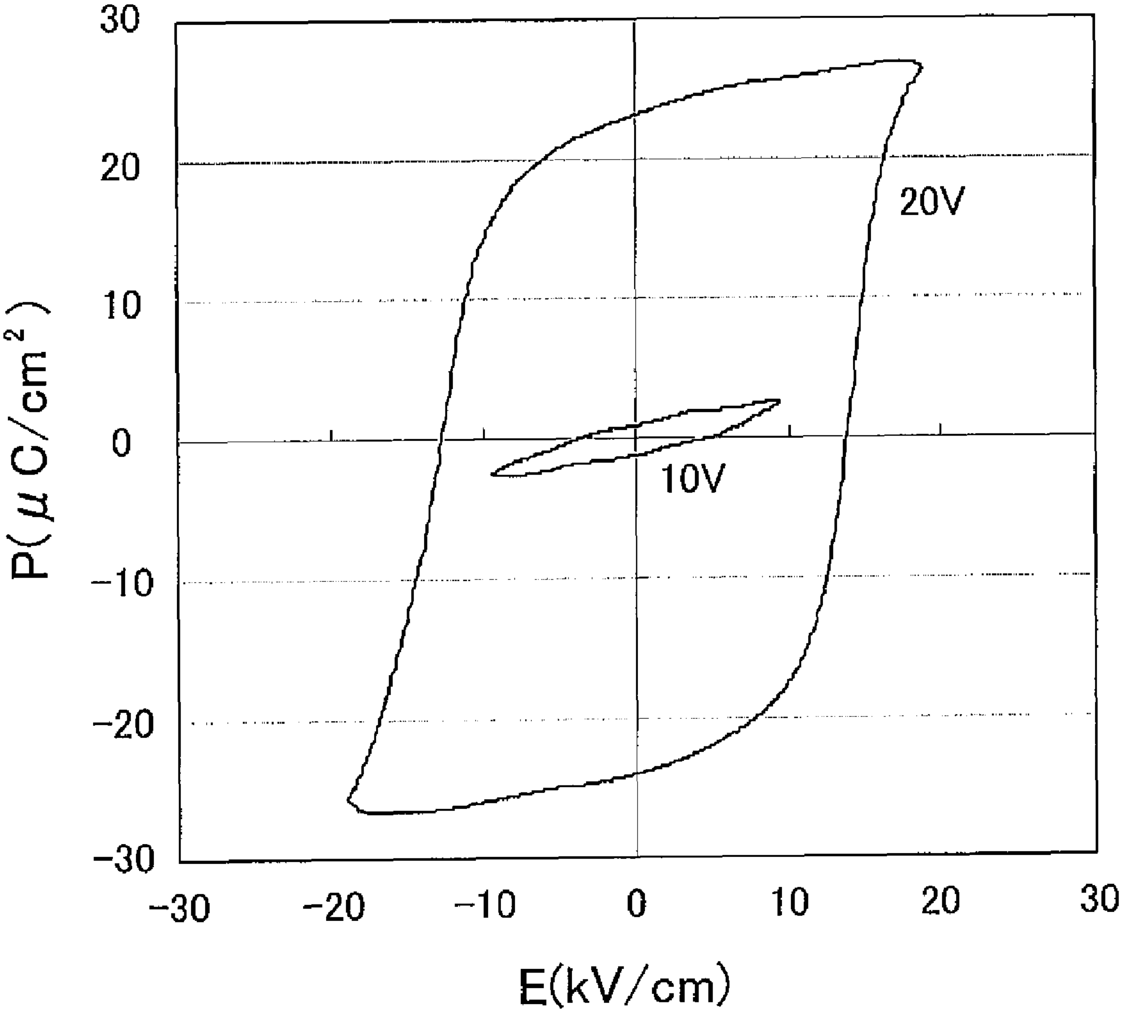
[FIG. 9] A graph showing P-E hysteresis characteristics measured at various voltages applied in the driving method according to the present invention as to the piezoelectric ceramic layer of the liquid ejector manufactured according to the aforementioned Example 1.

The liquid ejector 1 produced according to Example 1 was driven by the driving method according to the present invention and the conventional pull-push driving method with driving voltage waveforms generated similarly to the above while varying applied driving voltages. Then, displacements of the piezoelectric deformation region 8 of the piezoelectric actuator 7 similarly to the above was measured. The driving frequency was set to 2 kHz in both of the driving methods. The relation between the value of the first voltage ($-V_L$) [=the value of the second voltage ($+V_L$)] and the displacement of the piezoelectric deformation region 8 in the driving method according to the present invention and the relation between the voltage $V_H$ and the displacement of the piezoelectric deformation region 8 in the conventional pull-push driving method were plotted in FIG. 8. Consequently, the results confirmed that the values of the first and second voltages applied to the piezoelectric deformation region 8 in the driving method according to the present invention for obtaining the same displacement can be reduced to about half of the value of the voltage $V_H$ applied in the conventional pull-push driving method, as shown in FIG. 8.

(Measurement of P-E Hysteresis Characteristics I)

A P-E hysteresis loop showing the relation between the intensity of electric field E (kV/cm) and the polarization quantity P (μC/cm$^2$) of the piezoelectric ceramic layer 6 was measured when a triangle wave having a frequency of 100 Hz and an amplitude of −10 to +10 V or a triangle wave having a frequency of 100 Hz and an amplitude of −20 to +20 V as models of the first and second voltages were applied to the piezoelectric deformation region 8 of the piezoelectric actuator 7 of the liquid ejector 1 produced according to Example 1. A ferroelectric characteristic evaluation system FCE-HS2 manufactured by Toyo Corporation was used for the measurement. Consequently, the results confirmed that the P-E hysteresis loop can be remarkably reduced when the first and second voltages are set to 10 V at which the intensity of electric field E (kV/cm) of the piezoelectric deformation region 8 of the piezoelectric actuator 7 is not more than 0.8 times of the intensity of the coercive electric field Ec of the piezoelectric ceramic layer as compared with a case of setting the voltages to 20 V at which the intensity of electric field E exceeds 0.8 times of the intensity of the coercive electric field Ec. Since the thickness of the piezoelectric ceramic layer 6 is 10 μm, the intensity of electric field E (kV/cm) at the time of applying the voltage of 10 V to the piezoelectric deformation region 8 of the piezoelectric actuator 7 is 10 V/0.001 cm=10 kV/cm.

(Measurement of P-E Hysteresis Characteristics II)

Figure 10:
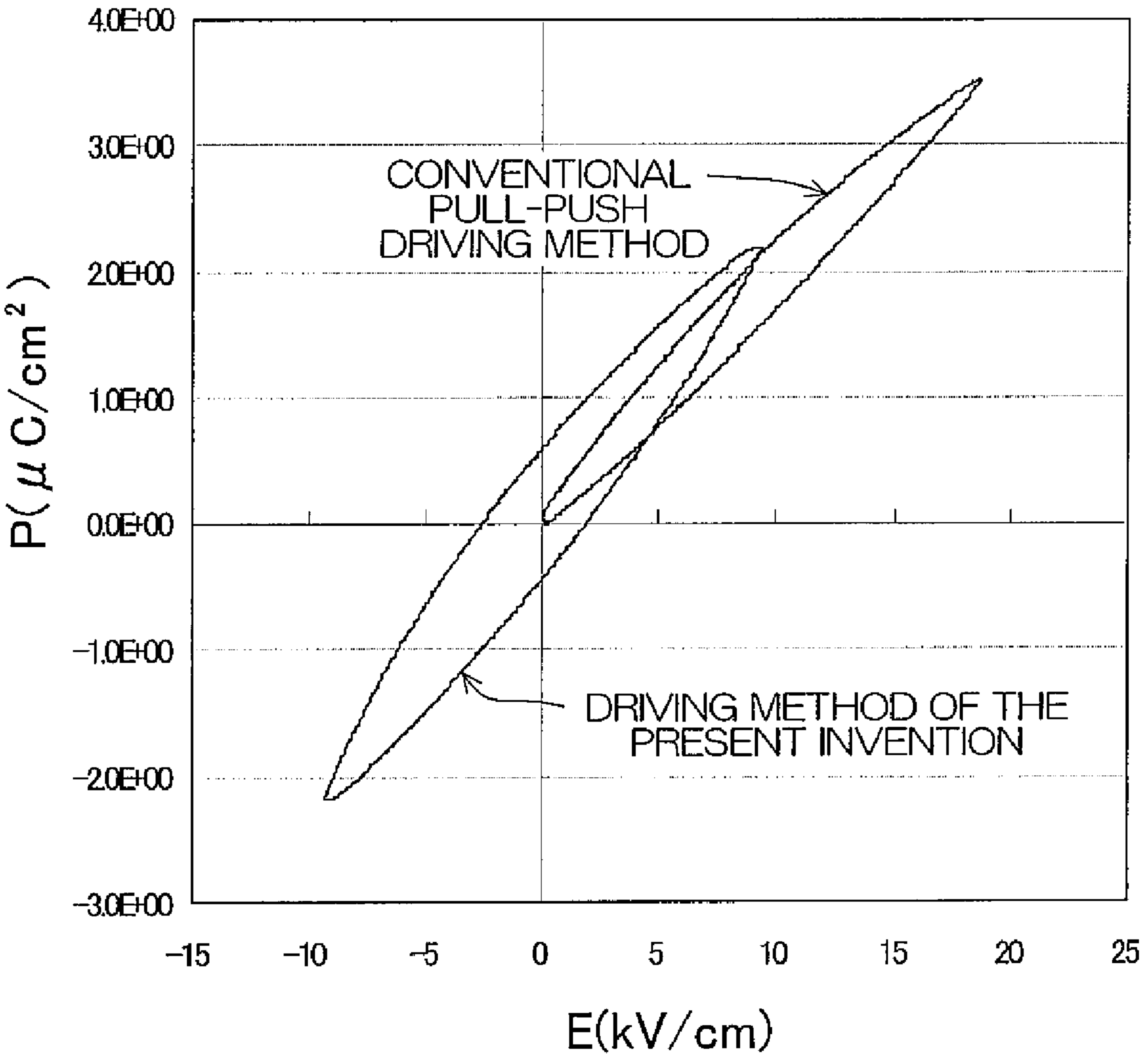
[FIG. 10] A graph showing P-E hysteresis characteristics measured by applying voltage waveforms corresponding to the driving method according to the present invention and the conventional pull-push driving method as to the piezoelectric ceramic layer of the liquid ejector manufactured according to the aforementioned Example 1.

FIG. 10 shows results obtained by measuring P-E hysteresis loops showing the relation between the intensity of electric field E (kV/cm) and the polarization quantity P (μC/cm$^2$) of the piezoelectric ceramic layer 6 at the time of applying a triangle wave having a frequency of 100 Hz and an amplitude of −10 to +10 V to the piezoelectric deformation region 8 of the piezoelectric actuator 7 of the liquid ejector 1 produced according to Example 1 as a model of the first and second voltages in the driving method according to the present invention or a triangle wave having a frequency of 100 Hz and an amplitude of 0 to +20 V thereto as a model of the voltage in the conventional pull-push driving method similarly to the above. When the areas of the respective P-E hysteresis loops were measured from FIG. 10, the results confirmed that the area of the P-E hysteresis loop in the driving method according to the present invention is 1.2 times, i.e., not more than 1.3 times of the area of the P-E hysteresis loop in the conventional pull-push driving method.

(Measurement of Crystalline State)

X-ray diffraction spectra at Bragg angles 2θ of 43 to 46° was measured when the liquid ejector 1 produced according to Example 1 was continuously driven by $10\times10^8$ cycles by the driving method according to the present invention and the conventional pull-push driving method with driving voltage waveforms generated similarly to the above, the piezoelectric ceramic layer 6 was taken out from the liquid ejector 1 and a circular X-ray beam having a diameter of 100 μm was spot-applied to the surfaces of the active region 15 and the inactive region 16 exposed by removing the individual electrode 10.

The C-axis orientations $I_C$ were obtained from the diffraction peak intensities of the [200] planes and those of the [002] planes in the X-ray diffraction spectra through the expression (1), while obtaining the ratios of these C-axis orientations $I_C$ to initial values of C-axis orientations $I_C$ previously measured as to the piezoelectric ceramic layer 6 before assemble into the piezoelectric actuator 7 similarly to the above.

Consequently, the results showed that the C-axis orientations $I_C$ of the active region 15 was remarkably changed to 1.5 times of the initial values and that of the inactive region 16 was 0.7 times of the initial values and the crystalline states were changed when the liquid ejector 1 was driven by the conventional pull-push driving method. On the other hand, the results confirmed that the C-axis orientation $I_C$ of the active region 15 was 1.04 times of the initial values and that of the inactive region 16 was 1.07 times of the initial values to remain generally unchanged and the initial crystalline states were maintained when the liquid ejector 1 was driven by the driving method according to the present invention.

Example 2

The liquid ejector 1 shown in FIG. 1 having a unimorphic piezoelectric actuator 7 was produced similarly to Example 1, except that the thickness of a piezoelectric ceramic layer 6 was set to 15 μm and a pressurizing chamber 2 was formed to have a plane shape of 2.2 mm by 0.65 mm. The coercive electric field Ec of the piezoelectric ceramic layer 6 was 17 kV/cm.

(Ejection Test)

When the driving voltage waveform ($+V_L$=15 V, $-V_L$=−15 V, driving frequency: 1 kHz) shown in FIG. 1 was applied to one piezoelectric deformation region 8 of the piezoelectric actuator 7 of the liquid ejector 1 produced according to Example 2 for driving the piezoelectric deformation region 8 by the driving method according to the present invention, so that a corresponding nozzle 3 ejected ink droplets under a condition of a head drop speed of 9 m/s. At the same time a strobe was flashed after 120 μs from the application of the driving voltage waveform for taking an image of ink droplets on a position of 1 mm from the distal end of the nozzle 3 to confirm that no noise vibration was caused since only two ink droplets of ordinary sizes were imaged. A similar image taken in relation to a nozzle 3 corresponding to a piezoelectric deformation region 8 adjacent to the driven piezoelectric deformation region 8 confirmed that no crosstalk was caused since no ink droplets were imaged.

When the driving voltage waveform ($V_H$=+30 V, driving frequency: 1 kHz) shown in FIG. 11 was applied to one piezoelectric deformation region 8 of the piezoelectric actuator 7 of the liquid ejector 1 for driving the piezoelectric deformation region 8 by the conventional pull-push driving method so that the corresponding nozzle 3 ejected ink droplets under a condition of a head drop speed of 9 m/s. At the same time a strobe was flashed after 120 μs from the application of the driving voltage waveform for taking an image of ink droplets on a position of 1 mm from the distal end of the nozzle 3 to confirm that noise vibration was caused since five ink droplets in total including two ink droplets of ordinary sizes and three small ink droplets were imaged. A similar image was taken in relation to a nozzle 3 corresponding to a piezoelectric deformation region 8 adjacent to the driven piezoelectric deformation region 8 confirmed that a crosstalk was caused since small ink droplets were imaged.

The invention claimed is:

1. A method for driving a liquid ejector that comprises (A) a substrate formed by arranging a plurality of liquid droplet ejecting portions each having a pressurizing chamber to be filled with a liquid and a nozzle communicating with the pressurizing chamber for ejecting the liquid from the pressurizing chamber as a liquid droplet in a plane direction; and (B) a plate-shaped piezoelectric actuator laminated on the substrate including at least one piezoelectric ceramic layer having a size covering a plurality of a pressurizing chambers of the substrate, while the piezoelectric actuator is divided into a plurality of piezoelectric deformation regions arranged correspondingly to the respective pressurizing chambers and individually deflected in a thickness direction by individual voltage application and a restricted region surrounding the piezoelectric deformation regions, characterized that:

a driving voltage waveform including a first voltage and a second voltage equivalent to the first voltage and opposite in polarity thereto is applied to an arbitrary piezoelectric deformation region of the piezoelectric actuator of the liquid ejector, for deflecting the piezoelectric deformation region in one thickness direction and the opposite direction each and varying a volume of the pressurizing chamber of the corresponding liquid droplet ejecting portion to eject a liquid droplet through the nozzle communicating with the pressurizing chamber.

2. The method for driving a liquid ejector according to claim 1, wherein the piezoelectric ceramic layer is made of a PZT-type piezoelectric ceramic material and divided into an active region corresponding to the piezoelectric deformation region and an inactive region corresponding to the restricted region, while the C-axis orientation $I_c$ of the ceramic material obtained from the intensity $I_{(200)}$ of a diffraction peak of the [200] plane and the intensity $I_{(002)}$ of a diffraction peak of the [002] plane in an X-ray diffraction spectrum by the following expression (1):

$$I_c = I_{(002)}/(I_{(002)}+I_{(200)}) \tag{1}$$

is kept in the range of 1 to 1.1 times as that in an undriven initial state after driving.

3. The method for driving a liquid ejector according to claim 1, wherein an area of a P-E hysteresis loop showing the relation between the intensity of electric field E (kV/cm) and the polarization quantity P (μC/cm$^2$) of the piezoelectric ceramic layer in driving by applying the driving voltage waveform to the piezoelectric deformation region of the piezoelectric actuator is set to not more than 1.3 times of an area of a P-E hysteresis loop in driving by applying a driving voltage waveform on-off controlling a single polarity voltage having a value twice of the value of the first and second voltages of the driving voltage waveform to the piezoelectric deformation region.

4. The method for driving a liquid ejector according to claim 1, wherein the first and second voltages are set to such a value that the intensity of electric field E (kV/cm) of the piezoelectric deformation region of the piezoelectric actuator is not more than 0.8 times of the intensity of a coercive electric field Ec of the piezoelectric ceramic layer.

5. The method for driving a liquid ejector according to claim 1, wherein a state is maintained applying no voltage to the piezoelectric deformation region in a standby state not ejecting liquid droplets.

6. The method for driving a liquid ejector according to claim 1, wherein the piezoelectric actuator comprises:

(i) a single piezoelectric ceramic layer divided into an active region corresponding to a piezoelectric deformation region expanded/contracted in the plane direction by voltage application in the thickness direction and an inactive region corresponding to the restricted region; and (ii) a oscillator plate laminated on one side of the piezoelectric ceramic layer and deflected in the thickness direction due to the expansion/contraction of the active region in the plane direction, and the piezoelectric deformation region of the piezoelectric actuator is vibrated in the thickness direction by applying the driving voltage waveform to the active region of the piezoelectric ceramic layer and expanding/contracting the active region in the plane direction.

7. The method for driving a liquid ejector according to claim 1, wherein the piezoelectric actuator comprises:

(I) a first piezoelectric ceramic layer divided into an active region corresponding to a piezoelectric deformation region expanded/contracted in the plane direction by voltage application in the thickness direction and an inactive region corresponding to the restricted region; and (II) a second piezoelectric ceramic layer laminated on one side of the first piezoelectric ceramic layer and expanded/contracted in the plane direction by voltage application in the thickness direction, and the piezoelectric deformation region of the piezoelectric actuator is vibrated in the thickness direction by expanding/contracting the second piezoelectric ceramic layer in antiphase with expansion/contraction of the active region synchronously with application of the driving voltage waveform to the active region of the first piezoelectric ceramic layer for expanding/contracting the active region in the plane direction.

8. The method for driving a liquid ejector according to claim 1, wherein the piezoelectric actuator comprises a single piezoelectric ceramic layer divided into an active region corresponding to the piezoelectric deformation region deflected in the thickness direction by voltage application and an inactive region corresponding to the restricted region, and the piezoelectric deformation region of the piezoelectric actuator is vibrated in the thickness direction by applying the driving voltage waveform to the piezoelectric ceramic layer.

* * * * *